United States Patent
Hikasa

(10) Patent No.: US 12,034,065 B2
(45) Date of Patent: Jul. 9, 2024

(54) SEMICONDUCTOR DEVICE INCLUDING EMITTER REGIONS AND METHOD OF MANUFACTURING THE SEMICONDUCTOR DEVICE

(71) Applicant: ROHM CO., LTD., Kyoto (JP)

(72) Inventor: Akihiro Hikasa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 210 days.

(21) Appl. No.: 16/997,224

(22) Filed: Aug. 19, 2020

(65) Prior Publication Data

US 2020/0381542 A1 Dec. 3, 2020

Related U.S. Application Data

(60) Continuation of application No. 16/126,796, filed on Sep. 10, 2018, now Pat. No. 10,763,344, which is a
(Continued)

(30) Foreign Application Priority Data

| Apr. 15, 2014 | (JP) | 2014-083755 |
| Apr. 15, 2014 | (JP) | 2014-083756 |
| Apr. 13, 2015 | (JP) | 2015-081869 |

(51) Int. Cl.
*H01L 29/739* (2006.01)
*H01L 29/06* (2006.01)
(Continued)

(52) U.S. Cl.
CPC ...... *H01L 29/7397* (2013.01); *H01L 29/0619* (2013.01); *H01L 29/0696* (2013.01);
(Continued)

(58) Field of Classification Search
CPC ............. H01L 29/4236; H01L 29/7395; H01L 29/7397; H01L 29/1095; H01L 29/66325;
(Continued)

(56) References Cited

U.S. PATENT DOCUMENTS

| 7,034,357 B2 | 4/2006 | Matsudai et al. |
| 7,230,300 B2 | 6/2007 | Onda et al. |

(Continued)

FOREIGN PATENT DOCUMENTS

| JP | H07050405 A | 2/1995 |
| JP | 2002100770 A | 4/2002 |

(Continued)

OTHER PUBLICATIONS

Notification of Reasons for Refusal of JP Patent Application No. JP 2015-081869 (related application); Onda Kazuhiko; Feb. 5, 2019; 18 pages.

(Continued)

*Primary Examiner* — Mohsen Ahmadi
(74) *Attorney, Agent, or Firm* — XSENSUS LLP

(57) ABSTRACT

A semiconductor device according to the present invention includes a first conductive-type semiconductor layer, a second conductive-type base region that is arranged in the front surface portion of the semiconductor layer, a plurality of trenches that extend from a front surface of the semiconductor layer beyond a bottom portion of the base region with an active region being defined therebetween, a plurality of first conductive-type emitter regions that are arranged in the active region, each connecting the trenches adjacent to each other, a gate electrode that is embedded in the trench, an embedding insulating film that is embedded in the trench on the gate electrode and that has an upper surface in the same height position as the front surface of the semiconductor layer or in a height position lower than the front surface and
(Continued)

an emitter electrode that covers the active region and the embedding insulating film and that is electrically connected to the base region and the emitter region.

20 Claims, 27 Drawing Sheets

Related U.S. Application Data division of application No. 15/443,735, filed on Feb. 27, 2017, now Pat. No. 10,090,404, which is a division of application No. 14/686,338, filed on Apr. 14, 2015, now Pat. No. 9,685,544.

(51) Int. Cl.
| | |
|---|---|
| *H01L 29/08* | (2006.01) |
| *H01L 29/10* | (2006.01) |
| *H01L 29/16* | (2006.01) |
| *H01L 29/40* | (2006.01) |
| *H01L 29/417* | (2006.01) |
| *H01L 29/423* | (2006.01) |
| *H01L 29/45* | (2006.01) |
| *H01L 29/49* | (2006.01) |
| *H01L 29/66* | (2006.01) |

(52) U.S. Cl.
CPC ...... *H01L 29/0804* (2013.01); *H01L 29/0821* (2013.01); *H01L 29/1004* (2013.01); *H01L 29/16* (2013.01); *H01L 29/41708* (2013.01); *H01L 29/42304* (2013.01); *H01L 29/4236* (2013.01); *H01L 29/456* (2013.01); *H01L 29/4916* (2013.01); *H01L 29/4958* (2013.01); *H01L 29/4966* (2013.01); *H01L 29/6634* (2013.01); *H01L 29/66348* (2013.01); *H01L 29/402* (2013.01); *H01L 29/42376* (2013.01); *H01L 29/7396* (2013.01)

(58) Field of Classification Search
CPC ............... H01L 29/0696; H01L 29/407; H01L 29/41708; H01L 29/66348; H01L 29/6634; H01L 29/4916; H01L 29/456; H01L 29/0619

See application file for complete search history.

(56) References Cited

U.S. PATENT DOCUMENTS

| | | |
|---|---|---|
| 7,834,416 B2 | 11/2010 | Williams et al. |
| 8,008,711 B2 | 8/2011 | Takahashi |
| 8,178,947 B2 | 5/2012 | Takahashi et al. |
| 8,399,907 B2 | 3/2013 | Parthasarathy et al. |
| 8,450,796 B2 | 5/2013 | Nakata |
| 8,853,774 B2 | 10/2014 | Cotorogea et al. |
| 8,994,102 B2 | 3/2015 | Hikasa |
| 9,029,874 B2 | 5/2015 | Horikawa et al. |
| 9,355,853 B2 | 5/2016 | Blanchard et al. |
| 2003/0042537 A1 | 3/2003 | Nakamura et al. |
| 2005/0280029 A1 | 12/2005 | Nakamura et al. |
| 2007/0148892 A1 | 6/2007 | Otake et al. |
| 2008/0315249 A1 | 12/2008 | Minato et al. |
| 2010/0059028 A1 | 3/2010 | Ueno |
| 2010/0090248 A1 | 4/2010 | Kouno |
| 2010/0240183 A1 | 9/2010 | Narazaki |
| 2010/0301386 A1* | 12/2010 | Lin ............... H01L 29/0834 257/140 |
| 2010/0314681 A1 | 12/2010 | Hsieh |
| 2010/0317158 A1* | 12/2010 | Yilmaz ........... H01L 29/7397 257/E21.267 |
| 2010/0327313 A1 | 12/2010 | Nakamura |
| 2012/0061723 A1 | 3/2012 | Ishii |
| 2012/0267680 A1 | 10/2012 | Oya et al. |
| 2014/0054644 A1* | 2/2014 | Hikasa ............ H01L 29/0696 257/139 |
| 2014/0061719 A1 | 3/2014 | Takei |
| 2014/0070270 A1 | 3/2014 | Yoshida et al. |
| 2014/0077256 A1 | 3/2014 | Hikasa |
| 2014/0339599 A1 | 11/2014 | Onozawa et al. |
| 2015/0076554 A1 | 3/2015 | Laven et al. |
| 2015/0145028 A1 | 5/2015 | Laven et al. |
| 2015/0221756 A1 | 8/2015 | Vellei et al. |
| 2015/0255586 A1* | 9/2015 | Naijo ............. H01L 29/66734 257/133 |
| 2016/0372585 A1* | 12/2016 | Furukawa ......... H01L 29/0821 |

FOREIGN PATENT DOCUMENTS

| | | | |
|---|---|---|---|
| JP | 2003101027 | A | 4/2003 |
| JP | 2003303967 | A | 10/2003 |
| JP | 2005209807 | A | 8/2005 |
| JP | 2005268679 | A | 9/2005 |
| JP | 2005340626 | A | 12/2005 |
| JP | 2006520091 | A | 8/2006 |
| JP | 2008085134 | A | 4/2008 |
| JP | 2008141056 | A | 6/2008 |
| JP | 2008282859 | A | 11/2008 |
| JP | 2009016480 | A | 1/2009 |
| JP | 2010129707 | A | 6/2010 |
| JP | 4785334 | B2 | 10/2011 |
| JP | 2013138137 | A | 7/2013 |
| JP | 2013182935 | A | 9/2013 |
| JP | 2013251466 | A | 12/2013 |
| JP | 2014060387 | A | 4/2014 |

OTHER PUBLICATIONS

Notification of Reasons for Refusal of JP Patent Application No. JP 2019-137136 (related application); Shibagaki, Hiroo; Jun. 25, 2020; 12 pages.

Japanese Patent Office; Notice of Reasons for Refusal for Japanese Patent Application 2021-069159 (related application); Nishide, Ryuji; Apr. 7, 2022; 6 pages.

Japanese Office Action issued Oct. 5, 2023, in corresponding Japanese Application No. 2022-170027, 6pp.

Office Action issued Feb. 22, 2024 in Japanese Patent Application No. 2022-170027, 8 pages.

\* cited by examiner

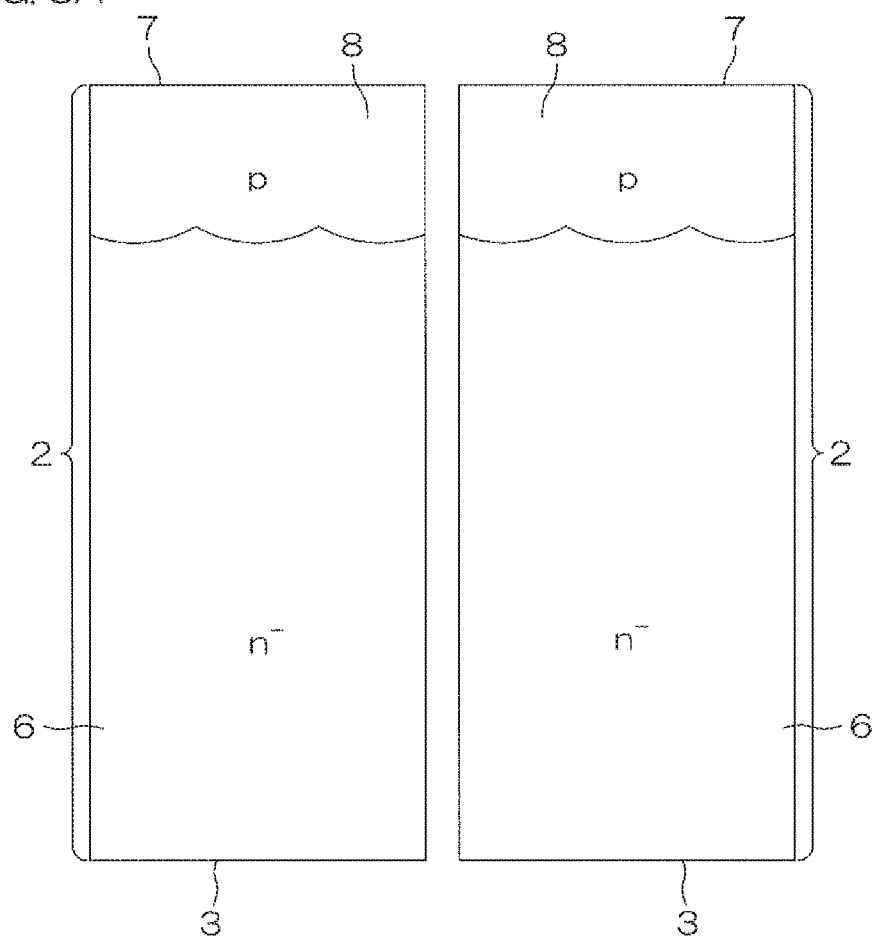

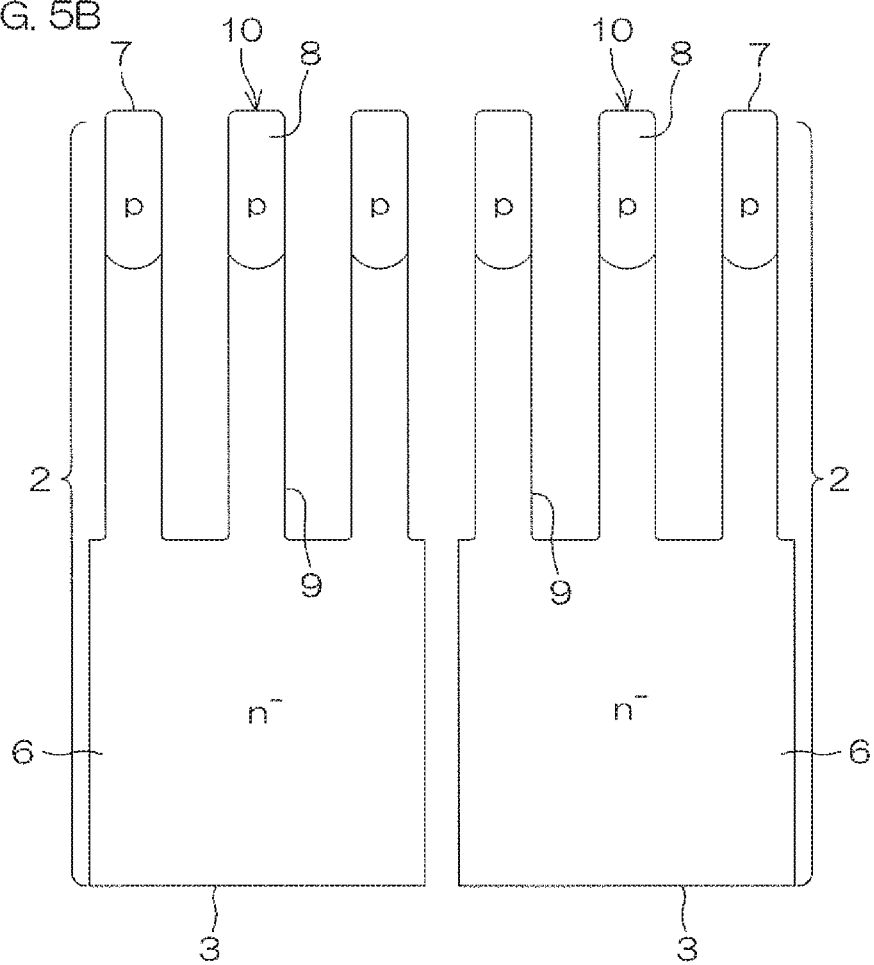

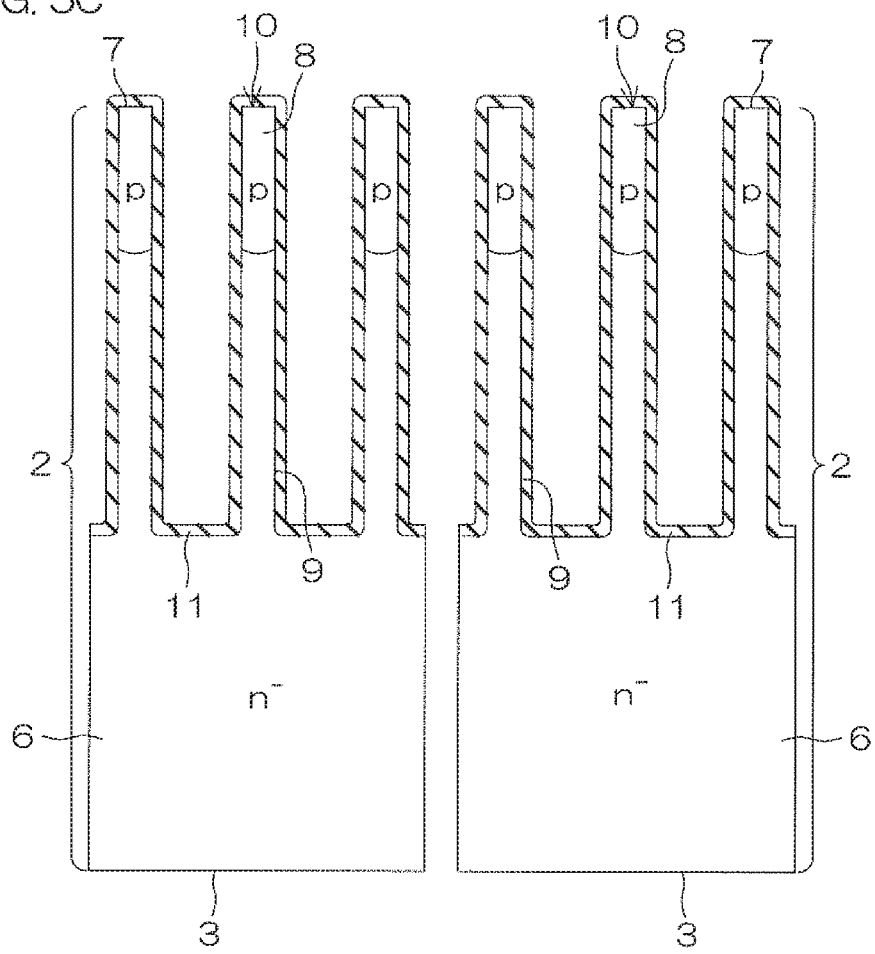

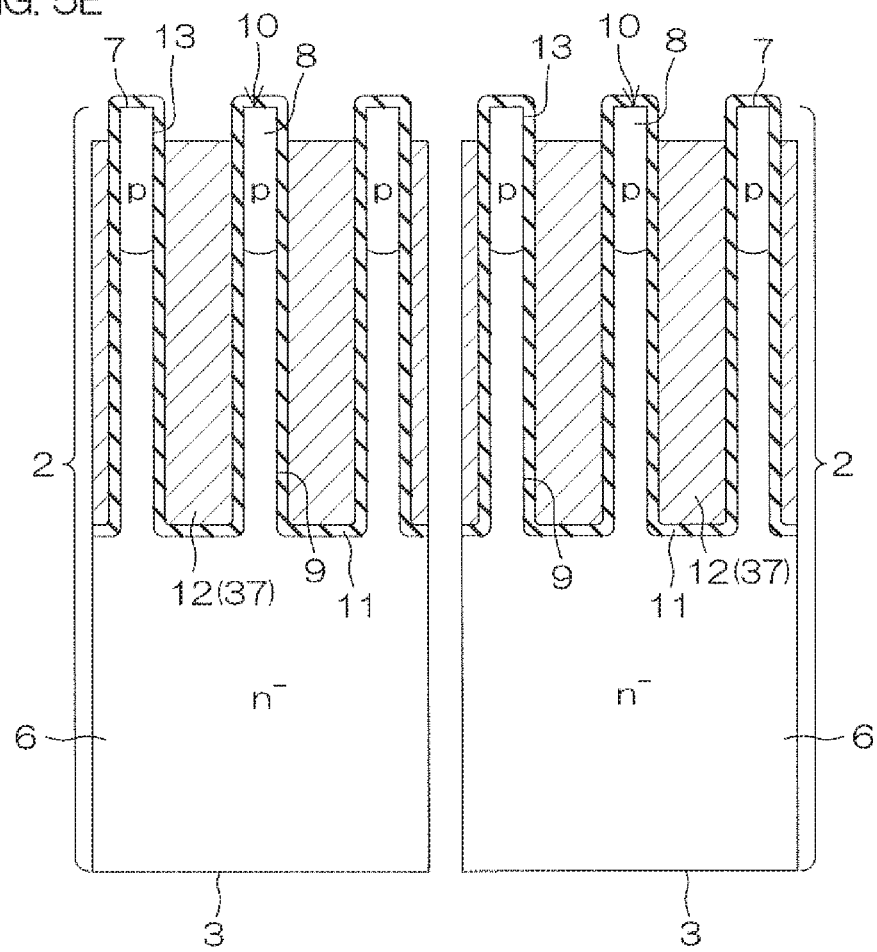

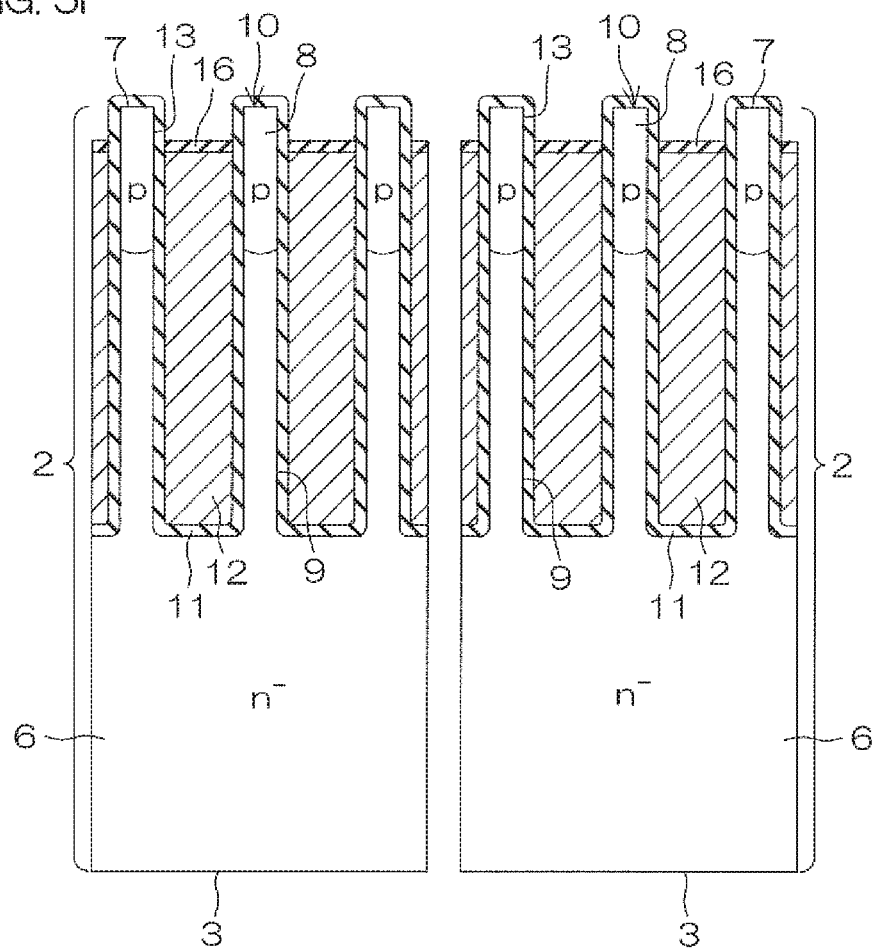

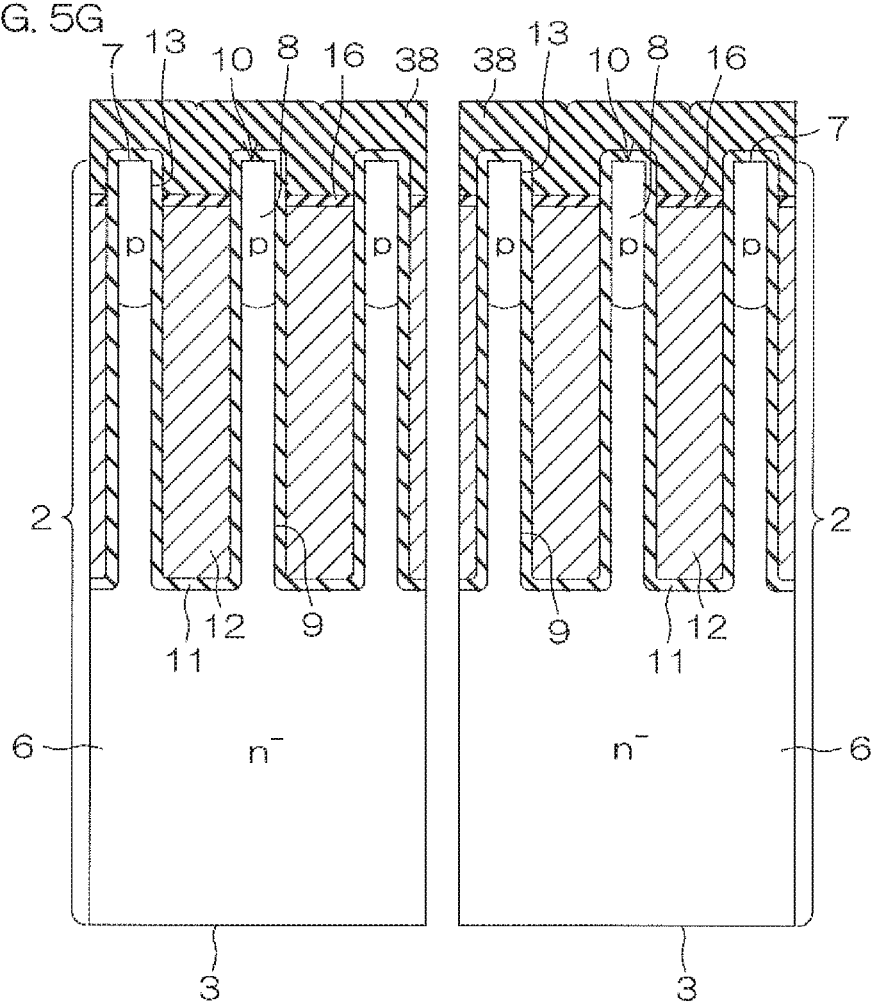

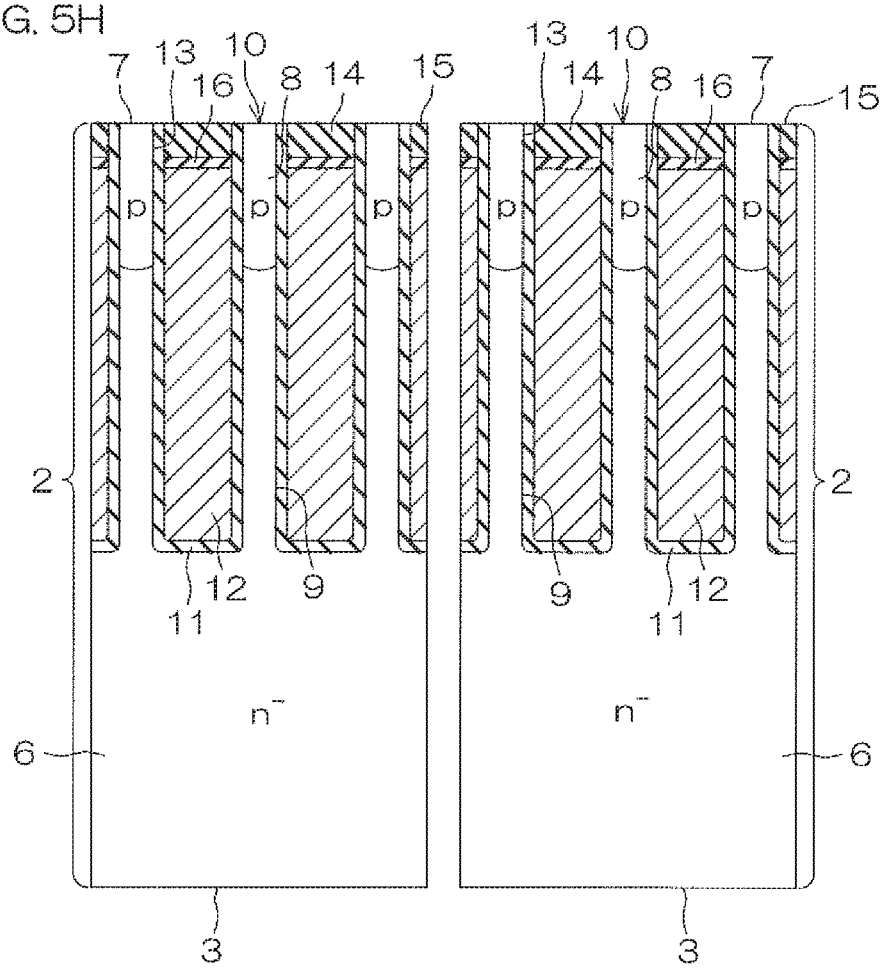

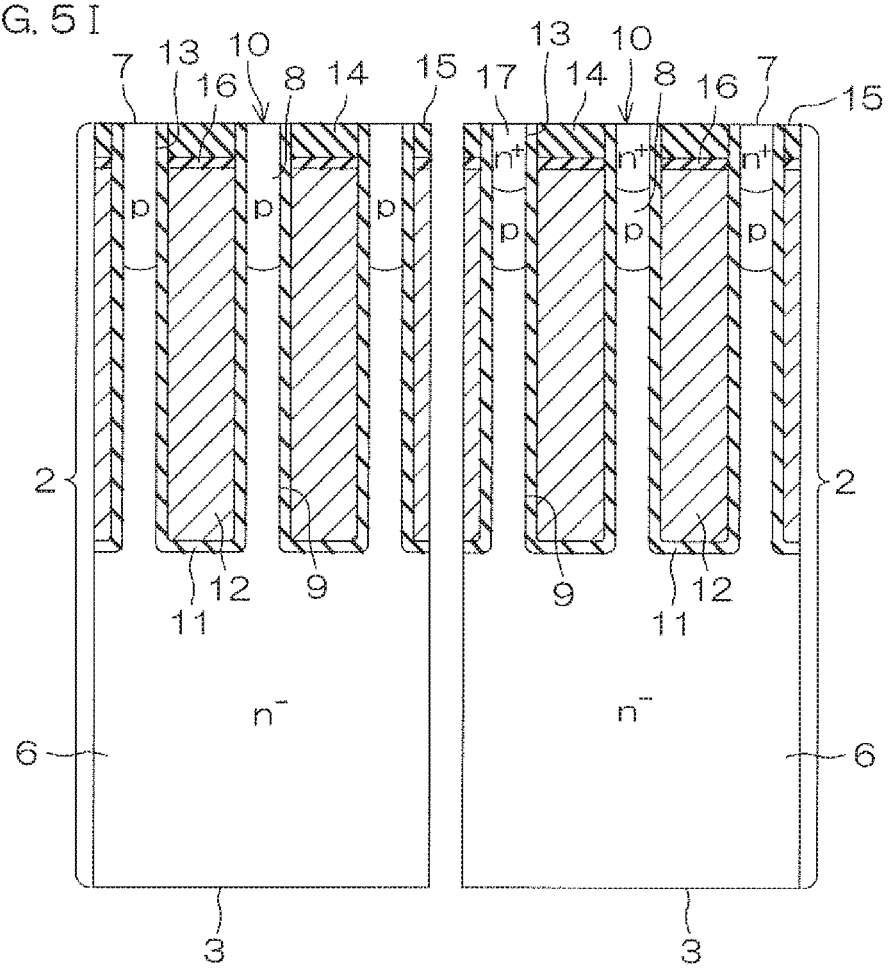

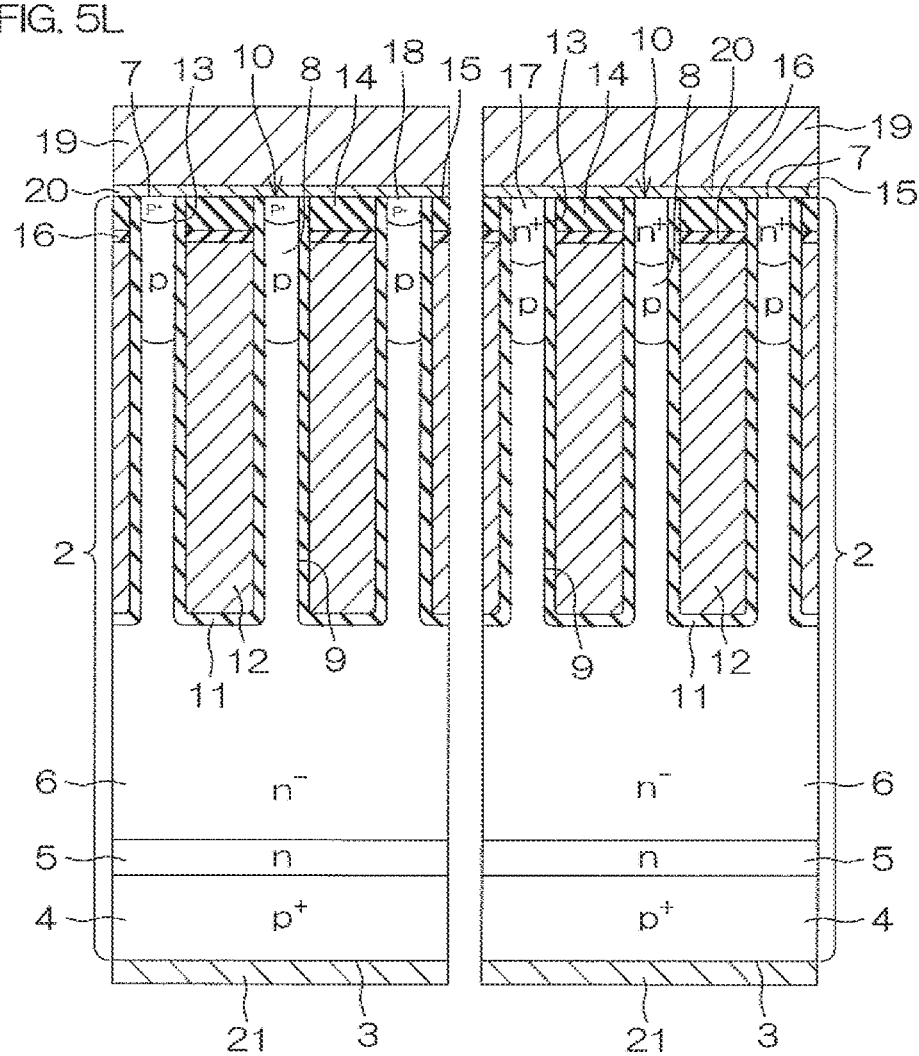

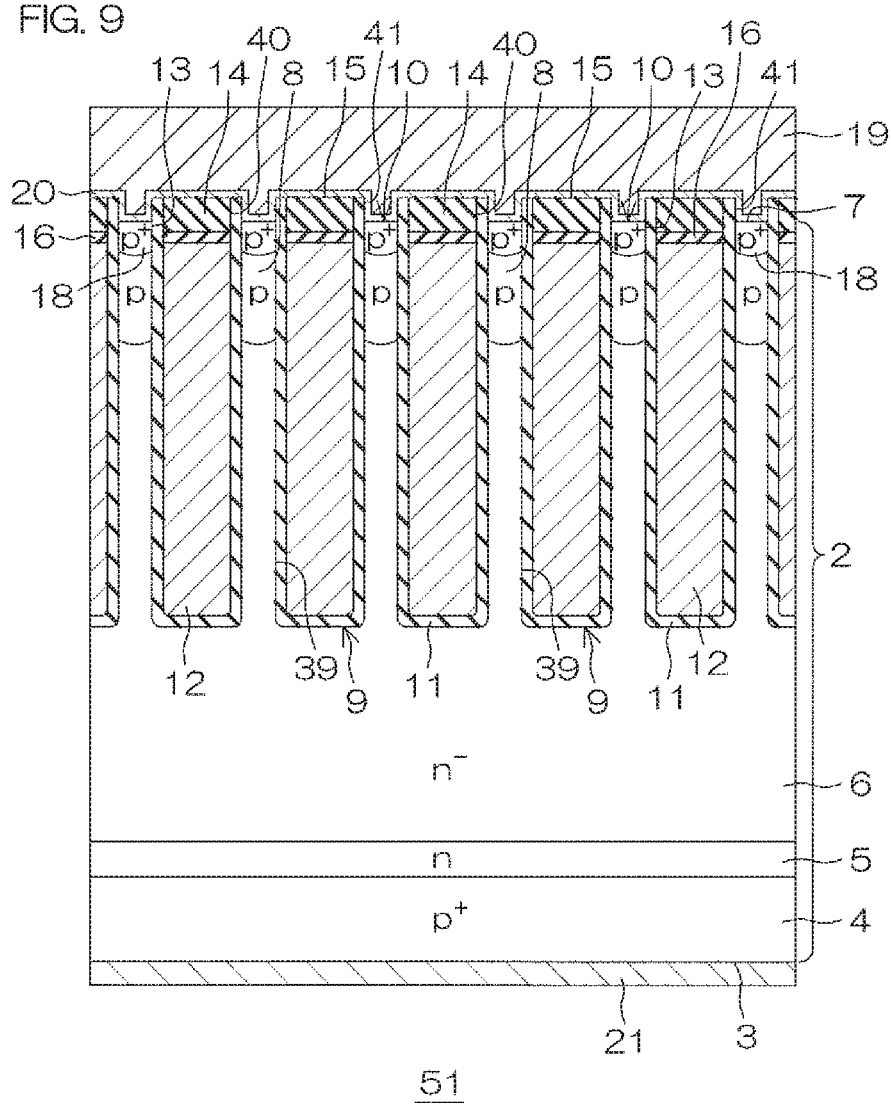

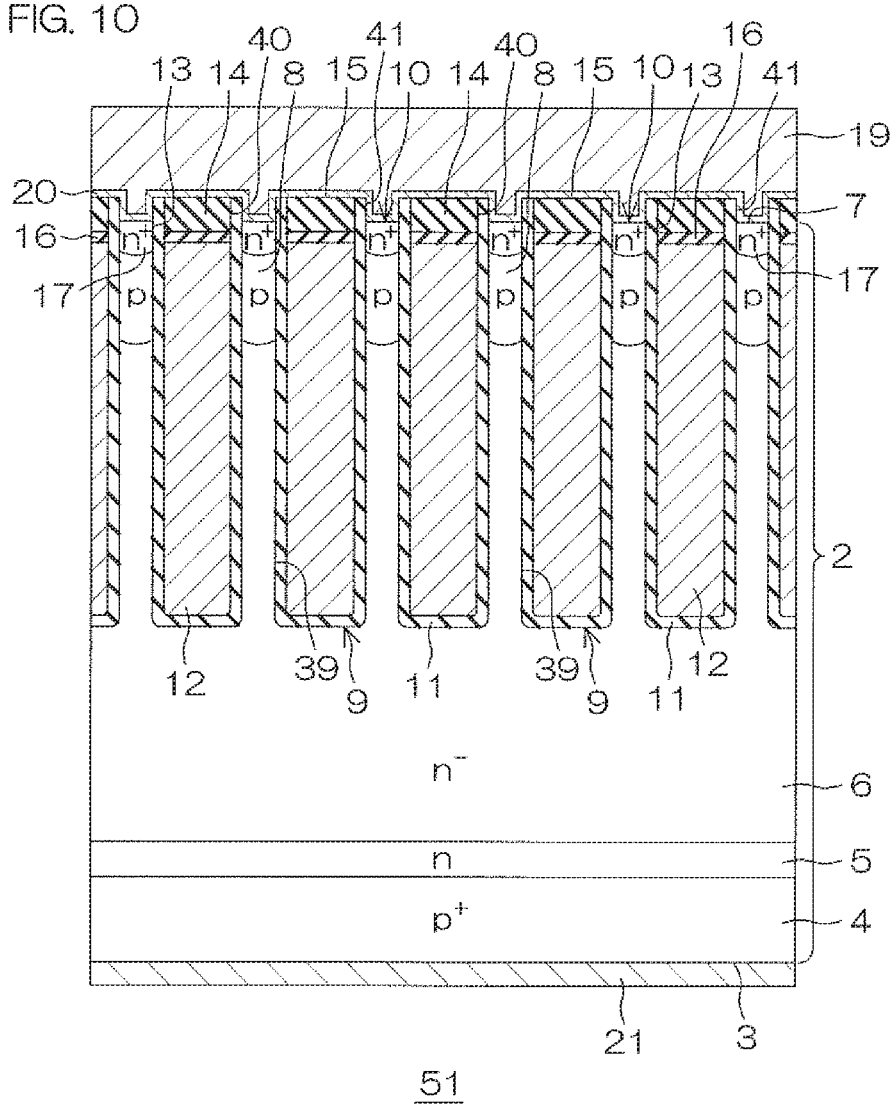

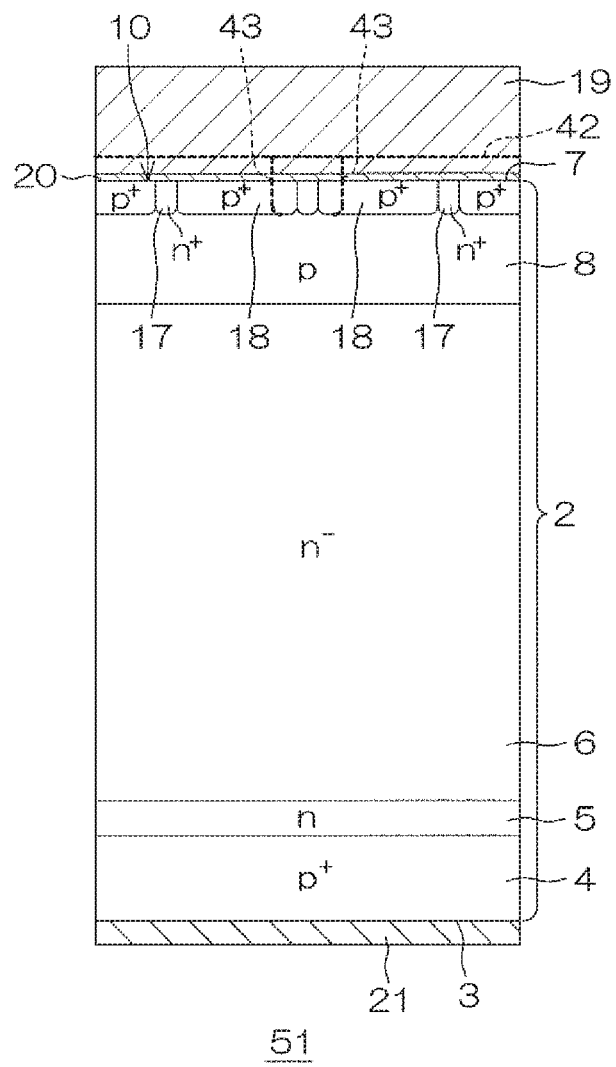

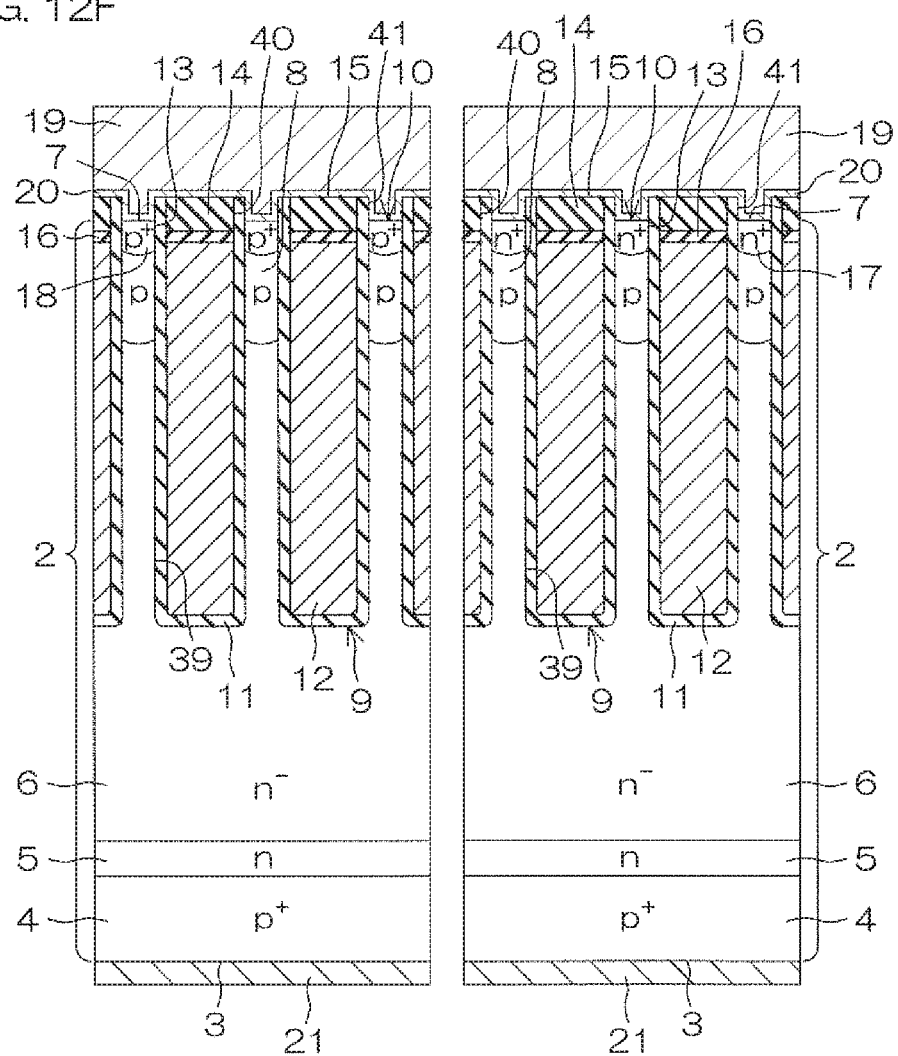

SEMICONDUCTOR DEVICE INCLUDING EMITTER REGIONS AND METHOD OF MANUFACTURING THE SEMICONDUCTOR DEVICE

CROSS-REFERENCE TO RELATED APPLICATIONS

This application is a continuation of U.S. application Ser. No. 16/126,796, filed Sep. 10, 2018, entitled SEMICONDUCTOR DEVICE INCLUDING EMITTER REGIONS AND METHOD OF MANUFACTURING THE SEMICONDUCTOR DEVICE, now issued as U.S. Pat. No. 10,763,344 on Sep. 1, 2020, which is a division of U.S. application Ser. No. 15/443,735, filed on Feb. 27, 2017, allowed on May 25, 2018, and issued as U.S. Pat. No. 10,090,404 on Oct. 2, 2018. U.S. patent application Ser. No. 15/443,735 is a division of U.S. application Ser. No. 14/686,338, filed on Apr. 14, 2015, issued on Jun. 20, 2018 as U.S. Pat. No. 9,685,544, which also corresponds to Japanese Patent Application No. 2014-083755 filed in the Japan Patent Office on Apr. 15, 2014, Japanese Patent Application No. 2014-083756 filed in the Japan Patent Office on Apr. 15, 2014, and Japanese Patent Application No. 2015-081869 filed in the Japan Patent Office on Apr. 13, 2015. The disclosures of these prior US and foreign applications are incorporated herein by reference.

FIELD OF THE INVENTION

The present invention relates to a semiconductor device including a trench gate IGBT and a method of manufacturing the same.

BACKGROUND ART

As a patent document disclosing a general trench gate IGBT, for example, Patent Document 1 (Japanese Patent No. 4785334) is known.

BRIEF SUMMARY OF THE INVENTION

In the structure of the IGBT in Patent Document 1, a gate electrode and an emitter electrode within a trench are insulated with an interlayer insulating film on the Si surface. In the interlayer insulating film, a contact hole that exposes the Si surface between adjacent trenches is formed. The emitter electrode is connected to the Si surface via the contact hole.

In such a structure, in order to prevent a short circuit from being produced between the gate electrode and the emitter electrode, it is necessary to design the position and the size of the contact hole including a margin (for example, 0.35 μm to 0.5 μm) with consideration given to the displacement of a mask, variations in dimension and the like. This constraint limits the spacing between the adjacent trenches and makes it difficult to reduce the size of a device.

An object of the present invention is to provide a semiconductor device that can reduce the size of a device without need of a design margin when a contact is formed in an emitter region and a method of manufacturing the same.

BRIEF DESCRIPTION OF THE DRAWINGS

FIGS. 5A to 5L are diagrams showing part of the manufacturing process of the semiconductor device.

FIG. 9 is a schematic cross-sectional view of the semiconductor device according to the preferred embodiment of the present invention and corresponds to a cross section of the semiconductor device taken along line A-A in FIG. 1.

FIG. 10 is a schematic cross-sectional view of the semiconductor device according to the preferred embodiment of the present invention and corresponds to a cross section of the semiconductor device taken along line B-B in FIG. 1.

FIG. 11 is a schematic cross-sectional view of the semiconductor device according to the preferred embodiment of the present invention and corresponds to a cross section of the semiconductor device taken along line C-C in FIG. 1.

FIGS. 12A to 12F are diagrams showing part of the manufacturing process of the semiconductor device in FIGS. 9 to 11.

DETAILED DESCRIPTION OF THE INVENTION

Figure 1:
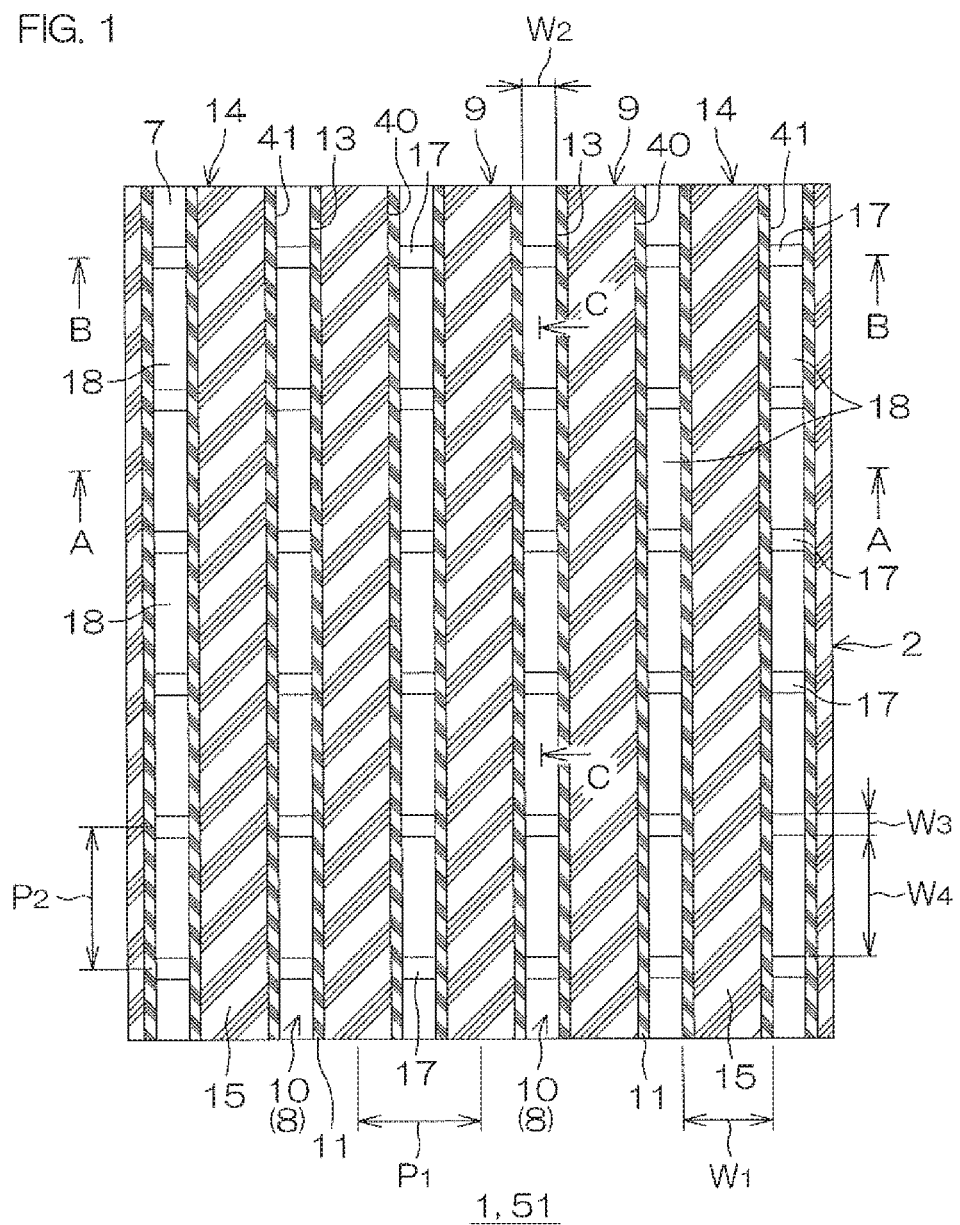
FIG. 1 is a schematic plan view of a semiconductor device according to a preferred embodiment of the present invention.

According to a preferred embodiment of the present invention, there is provided a semiconductor device including a first conductive-type semiconductor layer, a second conductive-type base region that is arranged in a front surface portion of the semiconductor layer, a plurality of trenches that extend from a front surface of the semiconductor layer beyond a bottom portion of the base region, an active region being defined therebetween, a plurality of first conductive-type emitter regions that are arranged in the active region, each connecting the trenches adjacent to each other, a gate electrode that is embedded in the trench, an embedding insulating film that is embedded in the trench on the gate electrode and that has an upper surface in the same height position as the front surface of the semiconductor layer or in a height position lower than the front surface and an emitter electrode that covers the active region and the embedding insulating film and that is electrically connected to the base region and the emitter region.

In this configuration, since it is possible to insulate the gate electrode and the emitter electrode with the embedding insulating film, the entire semiconductor surface of the active region between adjacent trenches can be used as an emitter contact region. Hence, when the contact is formed in the emitter region, it is not necessary to provide a design margin with consideration given to the displacement of a mask, variations in dimension and the like. Furthermore, since the structure of the emitter region is a bridged structure that connects adjacent trenches, it is not necessary to provide the same design margin. Consequently, it is possible to achieve a reduction in the size of the device without any design margin.

Then, the width of the active region is decreased by the reduction in the size, and thus a hole density in the semiconductor layer is increased, with the result that it is possible to reduce an on-voltage. Hence, while a relatively low on-voltage is maintained, the area ratio (the arrangement rate of the emitter regions) of the emitter regions to the base regions is adjusted, and thus it is possible to easily control the short circuit resistance value. Consequently, it is possible to improve the trade-off relationship between the on-voltage and the short circuit resistance amount.

In the preferred embodiment of the present invention, the emitter electrode may be a flat electrode.

In this configuration, it is possible to enhance the joint strength when a wiring member such as a bonding wire is joined to the emitter electrode.

In the preferred embodiment of the present invention, a second conductive-type base contact region may be included that is selectively arranged in the active region and that is connected to the base region at a bottom portion.

The base contact region may be formed shallower than the emitter region.

The base contact region may be formed shallower than the embedding insulating film, and the emitter region may be formed deeper than the embedding insulating film.

The base contact region may be formed in the entire region of the active region other than the emitter region.

The trenches may be formed in a stripe shape, and the emitter regions may be formed in a stripe shape perpendicularly intersecting the trenches in the stripe shape.

The spacing between the trenches adjacent to each other may be 1 μm or less.

The spacing between the emitter regions adjacent to each other may be 3.5 μm to 10 μm.

The embedding insulating film may be formed of $SiO_2$, the gate electrode may be formed of polysilicon, the semiconductor layer may be formed of Si and the emitter electrode may be formed of an Al—Si—Cu alloy.

In the preferred embodiment of the present invention, a barrier layer may further be included that has a Ti/TiN/Ti multilayer structure arranged between the emitter electrode and the semiconductor layer.

According to the preferred embodiment of the present invention, there is provided a method of manufacturing a semiconductor device, the method including a step of forming a second conductive-type base region in a front surface portion of a first conductive-type semiconductor layer, a step of forming a plurality of trenches that extend from a front surface of the semiconductor layer beyond a bottom portion of the base region so as to define an active region therebetween, a step of embedding the trench with a gate electrode, a step of forming, by selectively removing the gate electrode from an upper portion, a space defined by a side surface of the trench on the gate electrode, a step of embedding, in the space, an embedding insulating film that has an upper surface in the same height position as the front surface of the semiconductor layer or in a height position lower than the front surface, a step of forming, in the active region, a plurality of first conductive-type emitter regions such that each of the emitter regions connects the trenches adjacent to each other and a step of forming an emitter electrode so as to cover the active region and the embedding insulating film.

By this method, it is possible to manufacture the semiconductor device described above.

The step of embedding the embedding insulating film may include a step of depositing an insulating material so as to cover the front surface of the semiconductor layer and a step of forming the embedding insulating film by etching back the insulating material until the front surface of the semiconductor layer is exposed.

The step of depositing the insulating material may include a step of depositing $SiO_2$ with a CVD method using a TEOS raw material.

According to the preferred embodiment of the present invention, there is provided a semiconductor device including a first conductive-type semiconductor layer, a second conductive-type base region that is arranged in a front surface portion of the semiconductor layer, a plurality of trenches that extend from a front surface of the semiconductor layer beyond a bottom portion of the base region, a gate electrode that is embedded in the trench, an insulating film that protrudes beyond the front surface of the semiconductor layer on the gate electrode and that has a side surface continuous to a side surface of the trench, a dug structure which is formed by a step between the semiconductor layer and the insulating film and in which an active region formed with the semiconductor layer is defined in a bottom portion, a first conductive-type emitter region that is selectively arranged in the active region and an emitter electrode that covers the active region and the insulating film and that is electrically connected to the base region and the emitter region.

In this configuration, since it is possible to insulate the gate electrode and the emitter electrode with the insulating film having a side surface continuous to the side surface of the trench, the entire semiconductor surface of the active region between adjacent trenches can be used as an emitter contact region. Hence, when the contact is formed in the emitter region, it is not necessary to provide a design margin with consideration given to the displacement of a mask, variations in dimension and the like. Consequently, it is possible to achieve a reduction in the size of the device without any design margin.

Then, the width of the active region is decreased by the reduction in the size, and thus a hole density in the semiconductor layer is increased, with the result that it is possible to reduce an on-voltage. Hence, while a relatively low on-voltage is maintained, the area ratio (the arrangement rate of the emitter regions) of the emitter regions to the base regions is adjusted, and thus it is possible to easily control the short circuit resistance value. Consequently, it is possible to improve the trade-off relationship between the on-voltage and the short circuit resistance amount.

Furthermore, since the dug structure is formed, it is possible to reduce the distance from the semiconductor surface in the active region to the apex portion of the gate electrode. Hence, even if the emitter region is formed shallower as compared with a case where this structure is not formed, it is possible to reliably make the emitter region face the gate electrode. Since the emitter region is allowed to be shallow, it is possible to reduce the time in which the impurity is diffused when the emitter region is formed, and it is possible to reduce the spreading of the impurity laterally in a direction within a plane along the front surface of the semiconductor layer. In this way, it is possible to achieve the reduction in the size by reducing the loss of the pattern of the emitter region and to realize high performance by decreasing the depth (base length) of the base region from the front surface of the semiconductor.

The dug structure may be spread over an entire semiconductor region between the trenches adjacent to each other.

The emitter region may be formed so as to connect the trenches adjacent to each other.

In this configuration, since the structure of the emitter region is a bridged structure that connects adjacent trenches, it is not necessary to provide the same design margin. Consequently, it is possible to achieve a reduction in the size of the device without any design margin.

In the preferred embodiment of the present invention, a second conductive-type base contact region may be included that is selectively arranged in the active region and that is connected to the base region at a bottom portion.

The base contact region may be formed at the same depth as the emitter region.

The base contact region may be formed in an entire region of the active region other than the emitter region.

The trenches may be formed in a stripe shape, and the emitter regions may be formed in a stripe shape perpendicularly intersecting the trenches in the stripe shape.

A spacing between the trenches adjacent to each other may be 1 μm or less.

A plurality of the emitter regions may be formed along the trenches, and a spacing between the emitter regions adjacent to each other may be 3.5 μm to 10 μm.

The insulating film may be formed of $SiO_2$, the gate electrode may be formed of polysilicon, the semiconductor layer may be formed of Si and the emitter electrode may be formed of an Al—Si—Cu alloy.

The semiconductor device according to the present invention may further include a barrier layer that has a Ti/TiN/Ti multilayer structure arranged between the emitter electrode and the semiconductor layer.

According to the preferred embodiment of the present invention, there is provided a method of manufacturing a semiconductor device, the method including a step of forming a second conductive-type base region in a front surface portion of a first conductive-type semiconductor layer, a step of forming a plurality of trenches that extend from a front surface of the semiconductor layer beyond a bottom portion of the base region, a step of embedding the trench with a gate electrode, a step of forming, by selectively removing the gate electrode from an upper portion, a space defined by a side surface of the trench on the gate electrode, a step of embedding, in the space, an insulating film that has an upper surface in the same height position as the front surface of the semiconductor layer or in a height position lower than the front surface, a step of removing the semiconductor layer from the front surface in a self-aligned manner for the insulating film so as to form a dug structure in which an active region formed with the semiconductor layer is defined at a bottom portion, a step of selectively implanting a first conductive-type impurity in the dug structure and diffusing the first conductive-type impurity so as to form an emitter region in the active region and a step of forming an emitter electrode so as to cover the active region and the insulating film.

By this method, it is possible to manufacture the semiconductor device described above.

The step of embedding the insulating film may include a step of depositing an insulating material so as to cover the front surface of the semiconductor layer and a step of forming the insulating film by etching back the insulating material until the front surface of the semiconductor layer is exposed.

The step of depositing the insulating material may include a step of depositing $SiO_2$ with a CVD method using a TEOS raw material.

According to the preferred embodiment of the present invention, there is provided a semiconductor device including a first conductive-type semiconductor layer, a gate trench and an emitter trench that are formed in the semiconductor layer, a gate electrode that is embedded in the gate trench, an embedding electrode that is embedded in the emitter trench, a second conductive-type base region that is formed in a front surface portion of the semiconductor layer between the gate trench and the emitter trench, a first conductive-type emitter region that is formed in a front surface portion of the base region, a first embedding insulating film that is embedded in the gate trench on the gate electrode and that has an upper surface in the same height position as a front surface of the semiconductor layer or in a height position lower than the front surface, a second embedding insulating film that is embedded in the emitter trench on the embedded electrode and that has an upper surface in the same height position as the front surface of the semiconductor layer or in a height position lower than the front surface and an emitter electrode that covers the first and second embedding insulating films and that are electrically connected to the base region and the emitter region.

In the preferred embodiment of the present invention, a plurality of the emitter trenches may be formed, and the semiconductor device may include a second conductive-type floating region formed between the emitter trenches.

A preferred embodiment of the present invention will be described in detail below with reference to the accompanying drawings.

Figure 2:
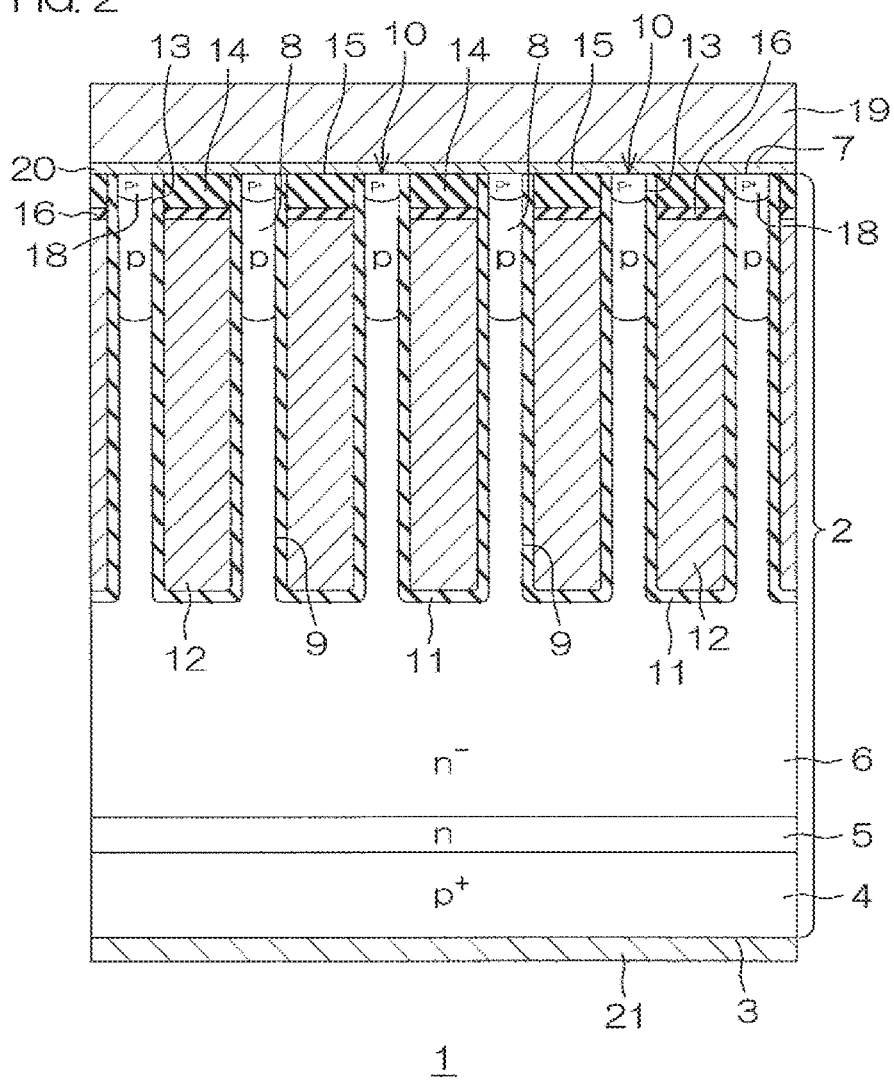
FIG. 2 is a schematic cross-sectional view of the semiconductor device according to the preferred embodiment of the present invention and corresponds to a cross section of the semiconductor device taken along line A-A in FIG. 1.
Figure 3:
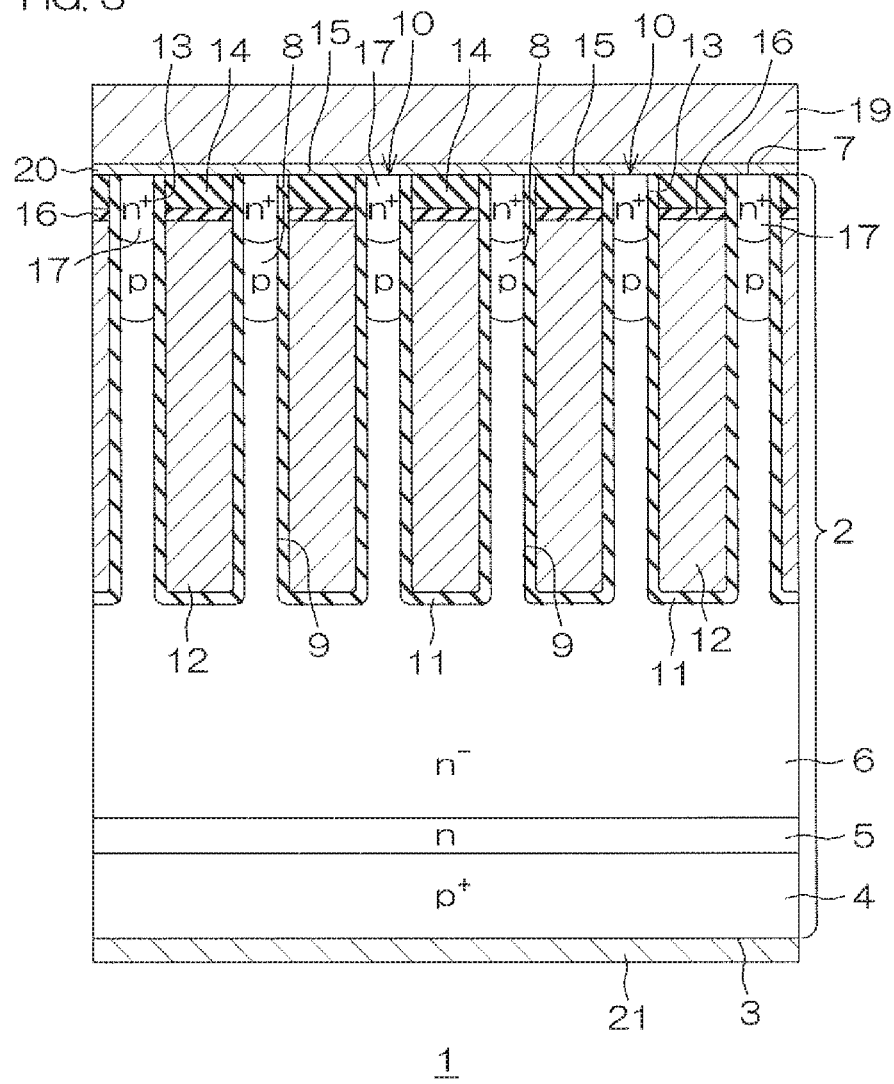
FIG. 3 is a schematic cross-sectional view of the semiconductor device according to the preferred embodiment of the present invention and corresponds to a cross section of the semiconductor device taken along line B-B in FIG. 1.

FIG. 1 is a schematic plan view of semiconductor devices 1 and 51 according to the preferred embodiment of the present invention. FIGS. 2 and 3 are schematic cross-sectional views of the semiconductor device 1, and respectively correspond to cross sections taken along lines A-A and B-B in FIG. 1. Although FIG. 1 is a plan view, some constituent elements are hatched for clarity.

The semiconductor device 1 is a device that includes a trench gate IGBT, and includes a semiconductor substrate 2 as an example of the semiconductor layer of the present invention. The semiconductor substrate 2 may be an n⁻-type silicon substrate having a thickness of, for example, 50 μm to 200 μm.

The semiconductor substrate 2 has a structure in which a p⁺-type collector region 4, an n-type buffer region 5 and an n⁻-type drift region 6 are sequentially deposited in layers from its back surface 3 toward the front surface 7.

As a p-type dopant of the p⁺-type collector region 4, for example, B (boron), Al (aluminum) or the like can be used (the same applies for a p-type impurity region in the following description). On the other hand, as an n-type dopant of the n-type buffer region 5 and the n⁻-type drift region 6, for example, N (nitrogen), P (phosphorus), As (arsenic) or the like can be used (the same applies for an n-type impurity region in the following description).

The dopant concentration of the p⁺-type collector region 4 is, for example, $1 \times 10^{15}$ cm⁻³ to $2 \times 10^{19}$ cm⁻³. On the other hand, the dopant concentration of the n-type buffer region 5 is, for example, $1 \times 10^{15}$ cm⁻³ to $5 \times 10^{17}$ cm⁻³, and the dopant concentration of the n⁻-type drift region 6 is, for example, $1 \times 10^{13}$ cm⁻³ to $5 \times 10^{14}$ cm⁻³.

In the front surface portion of the n⁻-type drift region 6, a p-type base region 8 is formed, and furthermore, a plurality of gate trenches 9 that extend from the front surface 7 beyond the bottom portion of the p-type base region 8 are formed. The dopant concentration of the p-type base region

8 is, for example, $1\times10^{16}$ cm$^{-3}$ to $1\times10^{18}$ cm$^{-3}$. The depth of the p-type base region 8 from the front surface 7 is, for example, 1.0 µm to 4.0 µm.

The gate trenches 9 are formed in a stripe shape parallel to each other. In this way, the p-type base region 8 between adjacent gate trenches 9 is divided into the stripe shape. The divided stripe-shaped semiconductor region (Si crystal region) is defined as an active region 10.

As shown in FIG. 1, the spacing $P_1$ of the adjacent gate trenches 9 (the distance between the centers of the gate trenches 9) is, for example, 1 µm or less. The width $W_1$ of the gate trench 9 is, for example, 0.6 µm to 3.0 µm, and the width W2 of the active region 10 is narrower than the width $W_1$ and is, for example, 0.5 µm to 1.5 µm.

In the gate trench 9, via a gate insulating film 11, a gate electrode 12 is embedded. The gate insulating film 11 is formed of, for example, SiO$_2$, and the gate electrode 12 is formed of, for example, polysilicon. The thickness of the gate insulating film 11 is, for example, 1100 to 1300 Å (in this preferred embodiment, 1200 Å).

The gate electrode 12 is embedded halfway along the direction of the depth of the gate trench 9. In this way, in the gate trench 9, above the gate electrode 12, a space 13 defined by the upper surface of the gate electrode 12 and both side surfaces of the gate trench 9 is formed.

The space 13 is shallower than the p-type base region 8 and forms, for example, a shallow trench that extends over the entire region of the gate trench 9 in the longitudinal direction. The depth of the space 13 from the front surface 7 is, for example, 0.2 µm to 0.5 µm.

In the space 13, an embedding insulating film 14 is embedded. The embedding insulating film 14 is formed of, for example, SiO$_2$. The embedding insulating film 14 has an upper surface 15 in the same height position as the front surface 7 of the active region 10 or in a height position lower than the front surface 7. When the upper surface 15 is in the height position lower than the front surface 7 of the active region 10, its difference in height is caused by a recess formed by slightly over-etching an insulating material 38 when the insulating material 38, which will be described later, is etched back. Hence, the front surface 7 of the semiconductor substrate 2 is a flat surface in which the semiconductor (Si) surface and the insulator (SiO$_2$) surface are continuous without any step or is a substantially flat surface in which the insulation (SiO$_2$) surface is slightly recessed with respect to the semiconductor (Si) surface to form an extremely shallow concave portion.

Between the embedding insulating film 14 and the gate electrode 12, an insulting thin film 16 intervenes. The insulting thin film 16 is formed, for example, of SiO$_2$. The insulting thin film 16 is thinner than the gate insulating film 11, and has a thickness of, for example, 150 to 250 Å (in this preferred embodiment, 200 Å).

In the active region 10, in the front surface portion of the p-type base region 8, a plurality of n$^+$-type emitter regions 17 are formed. Each of the n$^+$-type emitter regions 17 is formed so as to connect adjacent gate trenches 9. That the n$^+$-type emitter region 17 connects adjacent gate trenches 9 means that as shown in FIG. 1, each of the n$^+$-type emitter regions 17 is not divided while extending from one gate trench 9 to the other gate trench 9.

The n$^+$-type emitter regions 17 are aligned in a stripe shape that perpendicularly intersects the gate trenches 9 in the stripe shape. In this way, the gate trenches 9 and the n$^+$-type emitter regions 17 as a whole are formed in a lattice shape in a plan view. As shown in FIG. 1, the spacing $P_2$ of the adjacent n$^+$-type emitter regions 17 (the distance between the centers of the n$^+$-type emitter regions 17) is, for example, 3.5 µm to 10 µm. The width $W_3$ of the n$^+$-type emitter region 17 is, for example, 0.35 µm to 1.0 µm.

The n$^+$-type emitter region 17 is formed deeper than the bottom portion of the embedding insulating film 14, and is opposite to the gate electrode 12 via the gate insulating film 11. The depth of the n$^+$-type emitter region 17 from the front surface 7 is, for example, 0.6 µm to 0.8 µm. The dopant concentration of the n$^+$-type emitter region 17 is $1\times10^{19}$ cm$^{-3}$ to $5\times10^{20}$ cm$^{-3}$.

In the active region 10, in the front surface portion of the p-type base region 8, a plurality of p$^+$-type base contact regions 18 are formed. The p$^+$-type base contact regions 18 are formed in the entire region except the n$^+$-type emitter regions 17 in the active region 10. In other words, in the active region 10, in the front surface portion of the p-type base region 8, the n$^+$-type emitter regions 17 and the p$^+$-type base contact regions 18 are alternately arranged along the gate trenches 9. The width $W_4$ of the p$^+$-type base contact region 18 is wider than the width $W_3$, and is, for example, 3 µm to 9 µm. In the active region 10 described above, the area ratio (the arrangement rate of the n$^+$-type emitter regions 17) of the n$^+$-type emitter regions 17 to the p-type base regions 8 is, for example, 20% or less, and is preferably 10 to 15%. In this way, it is possible to achieve a satisfactory short circuit resistance amount.

The p$^+$-type base contact region 18 is formed shallower than the bottom portion of the n$^+$-type emitter region 17 and the embedding insulating film 14. The depth of the p$^+$-type base contact region 18 from the front surface 7 is, for example, 0.2 µm to 0.8 µm. The dopant concentration of the p$^+$-type base contact region 18 is, for example, $5\times10^{18}$ cm$^{-3}$ to $1\times10^{20}$ cm$^{-3}$.

On the semiconductor substrate 2, an emitter electrode 19 is formed. The emitter electrode 19 is formed of, for example, an Al—Si—Cu alloy. The emitter electrode 19 covers the active region 10 and the embedding insulating film 14 such that its one surface and the other surface are along the semiconductor (Si) surface and the insulator (SiO$_2$) surface in the front surface 7. Since as described above, the front surface 7 is a (substantially) flat surface, the emitter electrode 19 is a flat electrode following this flatness. Hence, it is possible to enhance the joint strength when a wiring member such as a bonding wire is joined to the emitter electrode 19.

Specifically, as shown in FIGS. 2 and 3, in the emitter electrode 19, a contact part that is in contact with the active region 10 and that is connected to the n$^+$-type emitter region 17 and the p$^+$-type base contact region 18 and a non-contact part that is in contact with the embedding insulating film 14 and that is opposite to the gate electrode 12 are continuous without any step. The non-contact part and the gate electrode 12 are insulated with the embedding insulating film 14.

Between the semiconductor substrate 2 and the emitter electrode 19, as shown in FIGS. 2 and 3, a barrier film 20 having a Ti/TiN/Ti multilayer structure may intervene.

A collector electrode 21 is formed in the back surface 3 of the semiconductor substrate 2. The collector electrode 21 has an Al Si/Ti/Ni/Au multilayer structure in which the layers are deposited sequentially from the back surface 3.

Figure 4:
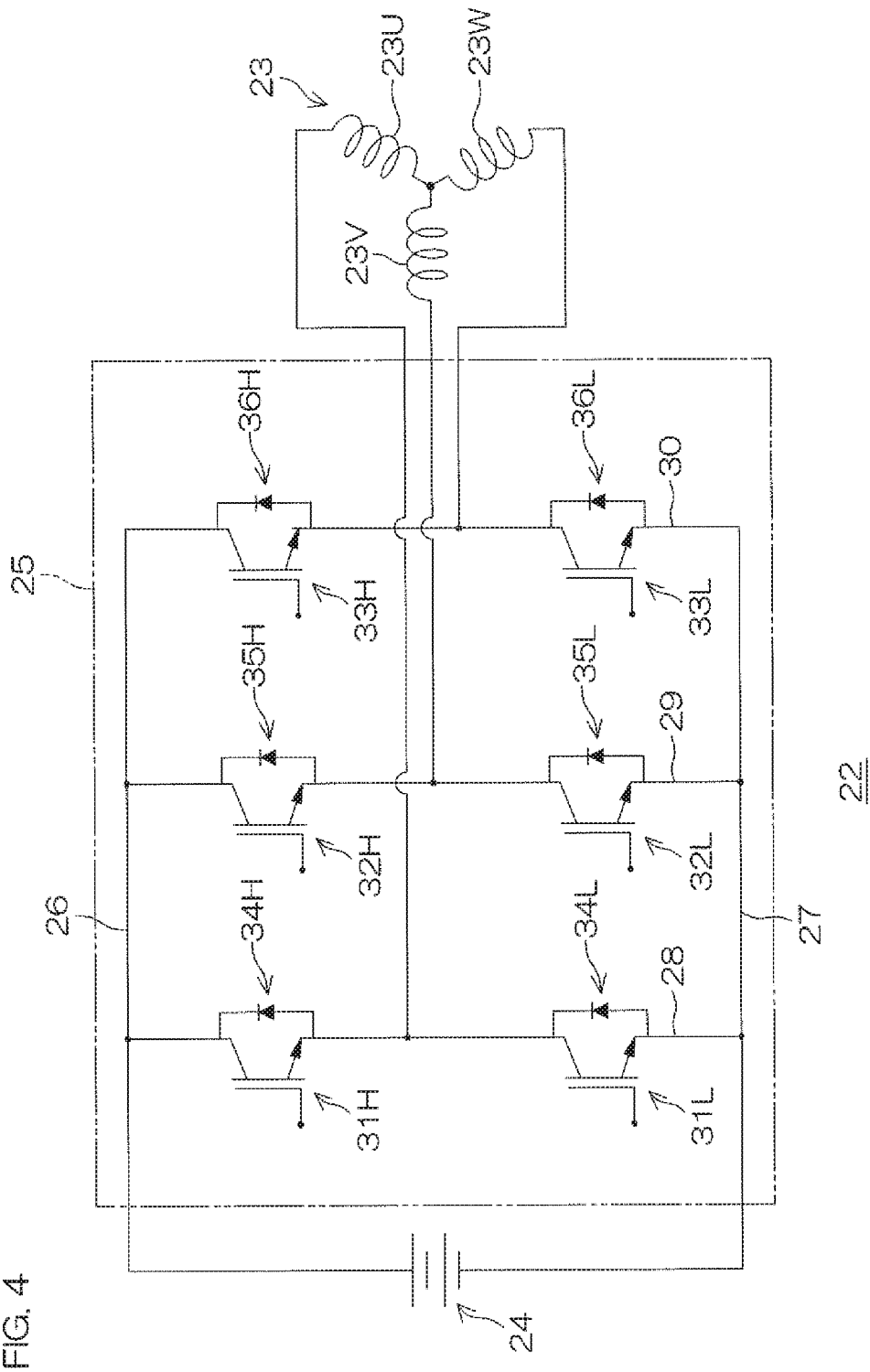
FIG. 4 is a circuit diagram of an inverter incorporating the semiconductor device.

The semiconductor device 1 can be used by being incorporated into, for example, an inverter circuit 22 as shown in FIG. 4. FIG. 4 is a circuit diagram of the inverter incorporating the semiconductor device 1.

The inverter circuit 22 is a three-phase inverter circuit that is connected to a three-phase motor 23 serving as an example of a load. The inverter circuit 22 includes a direct-current power supply 24 and a switch portion 25.

In this preferred embodiment, the direct-current power supply 24 is of, for example, 700V. In the direct-current power supply 24, a high-voltage side wiring 26 is connected to its high-voltage side, and a low-voltage wiring 27 is connected to its low-voltage side.

The switch portion 25 includes three arms 28 to 30 that respectively correspond to the U phase 23U, the V phase 23V and the W phase 23W of the three-phase motor 23.

The arms 28 to 30 are connected in parallel between the high-voltage side wiring 26 and the low-voltage wiring 27. The arms 28 to 30 respectively include high-side transistors (semiconductor device 1) 31H to 33H on the high-voltage side and low-side transistors (semiconductor device 1) 31L to 33L on the low-voltage side. Regenerative diodes 34H to 36H and 34L to 36L are connected in parallel to the transistors 31H to 33H and 31L to 33L in such a direction that a forward current flows from the low-voltage side to the high-voltage side.

In the inverter circuit 22, on/off control on the high-side transistors 31H to 33H and the low-side transistors 31L to 33L of the arms 28 to 30 is alternately switched, that is, a state where one transistor is switched on and the other transistor is switched off is alternately switched, and thus it is possible to pass an alternating-current to the three-phase motor 23. On the other hand, a state where both the transistors are switched off is produced, and thus it is possible to stop the passing of the current to the three-phase motor 23. In this way, a switching operation on the three-phase motor 23 is performed.

FIGS. 5A to 5L are diagrams showing part of the manufacturing process of the semiconductor device 1 in order of steps. In FIGS. 5A to 5L, the diagram on the left side of the plane of the sheet corresponds to the cross-sectional view of FIG. 2, and the diagram on the right side of the plane of the sheet corresponds to the cross-sectional view of FIG. 3.

In the manufacturing of the semiconductor device 1, as shown in FIG. 5A, a p-type dopant is ion-implanted (implantation) in the front surface 7 of the n⁻-type semiconductor substrate 2 (the n⁻-type drift region 6), and thereafter anneal processing is performed on the semiconductor substrate 2. In this way, the p-type dopant is subjected to drive-in diffusion, and thus the p-type base region 8 is formed.

Next, as shown in FIG. 5B, the semiconductor substrate 2 is selectively etched, and thus the gate trenches 9 are formed. The active region 10 is formed in a part sandwiched between adjacent gate trenches 9.

Next, as shown in FIG. 5C, the semiconductor substrate 2 is thermally oxidized, and thus the gate insulating film 11 is formed in the entire surface including the inner surface of the gate trench 9.

Figure 5D:
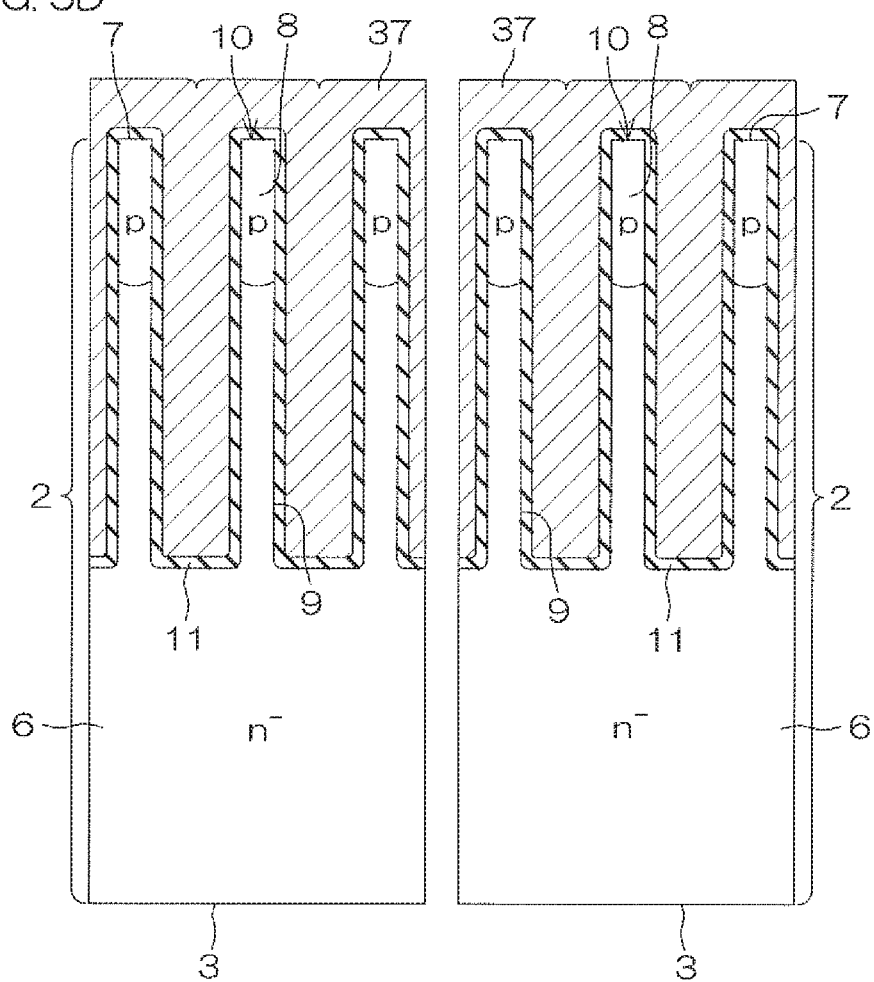

Next, as shown in FIG. 5D, for example, by a LPCVD (Low Pressure Chemical Vapor Deposition) method, an electrode material 37 such as polysilicon is deposited on the semiconductor substrate 2. The deposition of the electrode material 37 is continued until the gate trenches 9 are completely embedded and the semiconductor substrate 2 is covered by the electrode material 37.

Next, as shown in FIG. 5E, the electrode material 37 is etched back, and thus an unnecessary part of the electrode material 37 is removed. In this way, the gate electrode 12 that is embedded halfway along the direction of the depth of the gate trench 9 is formed, and the space 13 is formed above the gate electrode 12.

Next, as shown in FIG. 5F, the semiconductor substrate 2 is thermally oxidized, and thus the insulting thin film 16 (thermally oxidized film) is formed on the upper surface of the gate electrode 12 that is not covered by the gate insulating film 11.

Next, as shown in FIG. 5G, by a CVD method using a TEOS raw material, the insulating material 38 formed of $SiO_2$ is deposited on the semiconductor substrate 2. Thereafter, in order to flatten the surface of the insulating material 38, anneal processing may be performed on the semiconductor substrate 2. This anneal processing may be utilized so that the final depth is adjusted by checking the depth of the p-type base region 8 at this time which becomes gradually deeper through the heating step of FIGS. 5A (the drive-in diffusion), 5C (the gate thermal oxidation), 5D (the deposition of the polysilicon) and the like.

Next, as shown in FIG. 5H, the insulating material 38 is etched back, and thus an unnecessary part of the insulating material 38 is removed. In this way, the embedding insulating film 14 embedded in the space 13 is formed.

Next, as shown in FIG. 5I, an n-type dopant is ion-implanted (implantation) in the front surface 7 of the semiconductor substrate 2, and thereafter anneal processing is performed on the semiconductor substrate 2. In this way, the n-type dopant is subjected to drive-in diffusion, and thus the n⁺-type emitter region 17 is formed.

Figure 5J:
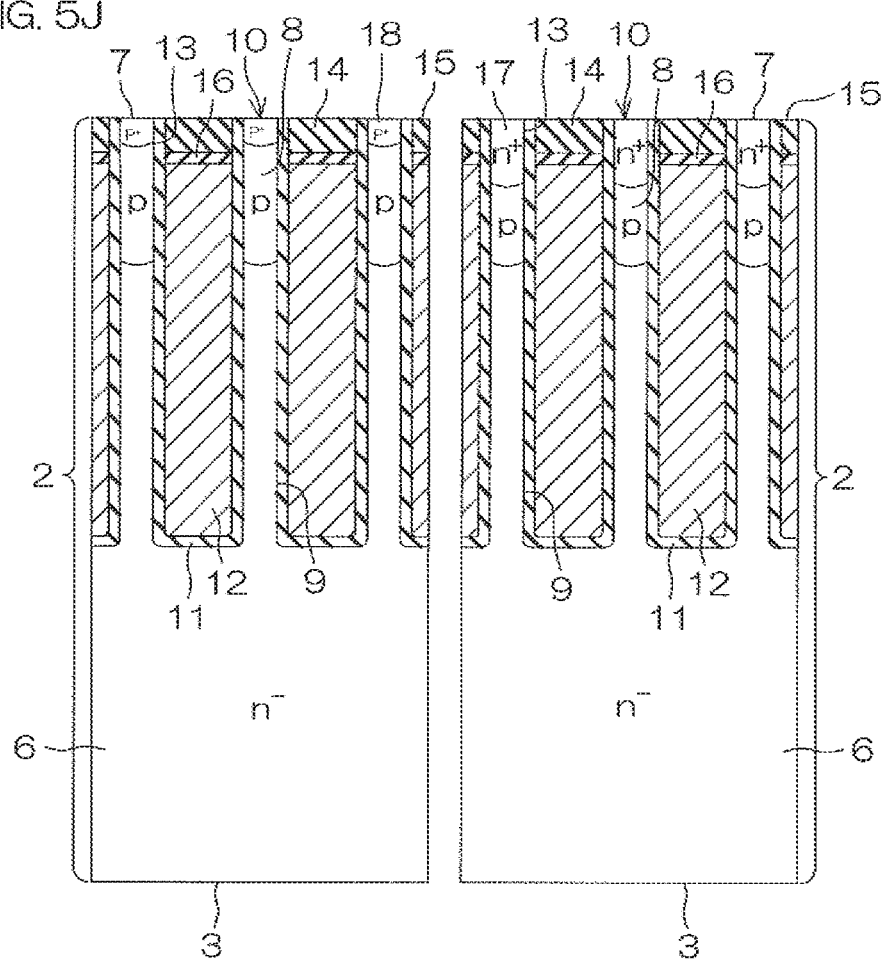

Next, as shown in FIG. 5J, a p-type dopant is ion-implanted (implantation) in the front surface 7 of the semiconductor substrate 2, and thereafter anneal processing is performed on the semiconductor substrate 2. In this way, the p-type dopant is subjected to drive-in diffusion, and thus the p⁺-type base contact region 18 is formed.

Figure 5K:
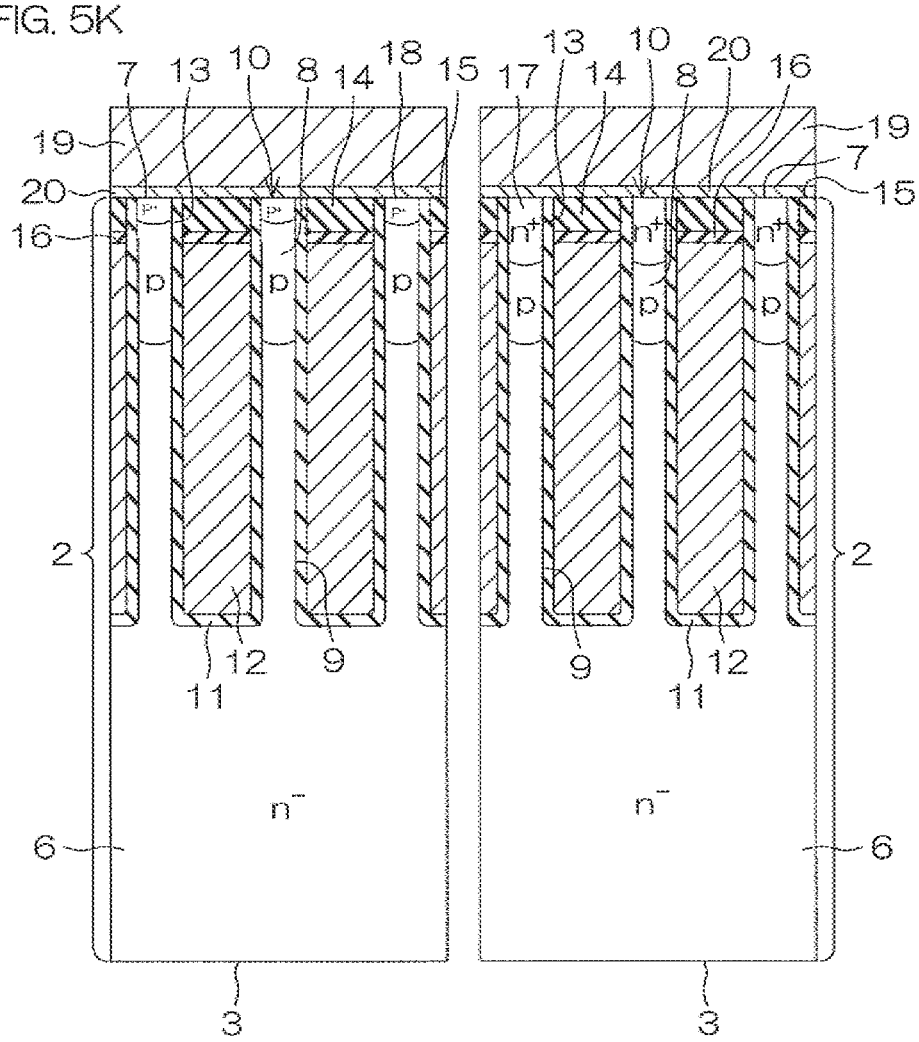

Next, on the semiconductor substrate 2, for example, by a sputtering method, a Ti film is deposited, and is subjected to anneal processing, and thereafter in the same method, a TiN film, a Ti film and an Al—Si—Cu alloy film are sequentially deposited. Then, the Ti/TiN/Ti/Al—Si—Cu alloy is patterned, and thus as shown in FIG. 5K, the emitter electrode 19 and the barrier film 20 are formed simultaneously.

Next, as necessary, the thickness of the semiconductor substrate 2 is reduced by grinding from the back surface 3, then as shown in FIG. 5L, n-type and p-type dopants are selectively ion-planted (implantation) in the back surface 3 of the semiconductor substrate 2 and thereafter anneal processing (in this preferred embodiment, laser anneal) is performed on the semiconductor substrate 2. In this way, the n-type and p-type dopants are subjected to drive-in diffusion to form the n-type buffer region 5 and the p⁺-type collector region 4. Thereafter, for example, by a sputtering method, an AlSi film, a Ti film, a Ni film and an Au film are deposited sequentially. In this way, the collector electrode 21 is formed.

The steps described above are performed, and thus it is possible to obtain the semiconductor device 1 shown in FIGS. 1 to 3. FIGS. 5A to 5L show only part of the manufacturing process of the semiconductor device 1, and the manufacturing process may include steps that are not shown in FIGS. 5A to 5L.

Since with this semiconductor device 1, as shown in FIGS. 2 and 3, it is possible to insulate the gate electrode 12 and the emitter electrode 19 with the embedding insulating film 14, the entire semiconductor (Si) surface of the active region 10 between adjacent gate trenches 9 can be used as an emitter contact region. Hence, preferably, after the formation of the n⁺-type emitter region 17 and the p⁺-type base contact region 18 (FIGS. 5I and 5J), without a step of forming an insulating film such as an interlayer insulating film on the semiconductor substrate 2, as shown in FIG. 5K, the material of the emitter electrode 19 is directly deposited.

Hence, when the contact is formed in the n⁺-type emitter region 17 and the p⁺-type base contact region 18, it is not necessary to provide a design margin with consideration given to the displacement of a mask, variations in dimension and the like in a direction perpendicularly intersecting the gate trench 9. Furthermore, since as shown in FIG. 1, the structure of the n⁺-type emitter region 17 is a bridged structure that connects adjacent gate trenches 9, in its formation, it is not necessary to provide the same design margin. Consequently, it is possible to achieve a reduction in the size of the device without any design margin.

Then, the width $W_2$ of the active region 10 is decreased by the reduction in the size, and thus a hole density in the vicinity of the interface between the p-type base region 8 and the n⁻-type drift region 6 is increased, with the result that it is possible to reduce an on-voltage. It is possible to prove the effect of increasing the hole density and the effect of reducing the on-voltage with FIGS. 6 and 7, respectively.

Figure 6:
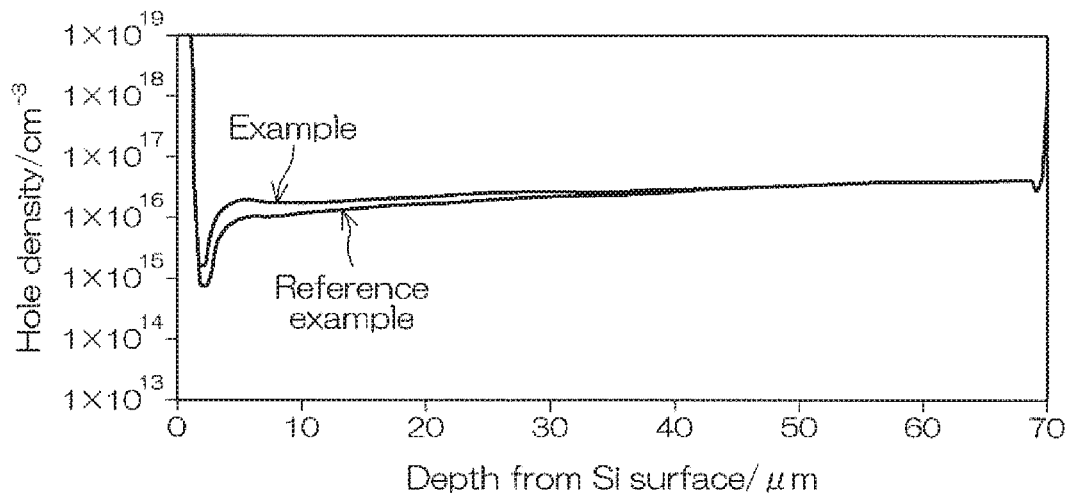
FIG. 6 is simulation data indicating a relationship between a depth from a Si surface and a hole density.
Figure 7:
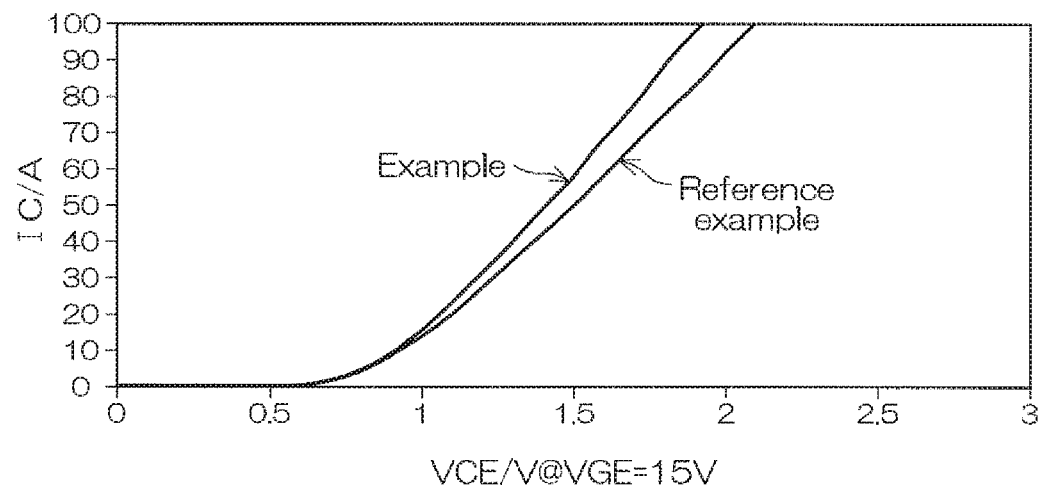
FIG. 7 is simulation data indicating a relationship between a collector-emitter voltage (VCE) and a collector current (IC).

FIG. 6 is simulation data indicating a relationship between the depth from the Si surface and the hole density. FIG. 7 is simulation data indicating a relationship between a collector-emitter voltage (VCE) and a collector current (IC).

In FIGS. 6 and 7, a solid line in an example indicates the result of the semiconductor device 1 according to this preferred embodiment. On the other hand, a reference example indicates the result of a semiconductor device in which as an insulating film for insulating the gate electrode 12 and the emitter electrode 19, instead of the embedding insulating film 14, the interlayer insulating film on the front surface 7 is adopted, and in which the spacing $P_1$ between the gate trenches 9 is widened as compared with the semiconductor device 1 with consideration given to the design margin for formation of the contact hole.

It is found from FIG. 6 that the hole density in the example is higher than that in the reference example regardless of the depth from the Si surface. It is clear from FIG. 7 that the on-voltage in the example is lower than that in the reference example.

Hence, it is found that as in the semiconductor device 1, the spacing $P_1$ between the gate trenches 9 is reduced, and thus it is possible to increase the hole density and reduce the on-voltage. Consequently, while the spacing $P_1$ is maintained to acquire a relatively low on-voltage, the area ratio (the arrangement rate of the n⁺-type emitter regions 17) of the n⁺-type emitter regions 17 to the p-type base regions 8 is adjusted, and thus it is possible to easily control the short circuit resistance value. In other words, with the semiconductor device 1, it is possible to improve the trade-off relationship between the on-voltage and the short circuit resistance amount.

Figure 8:
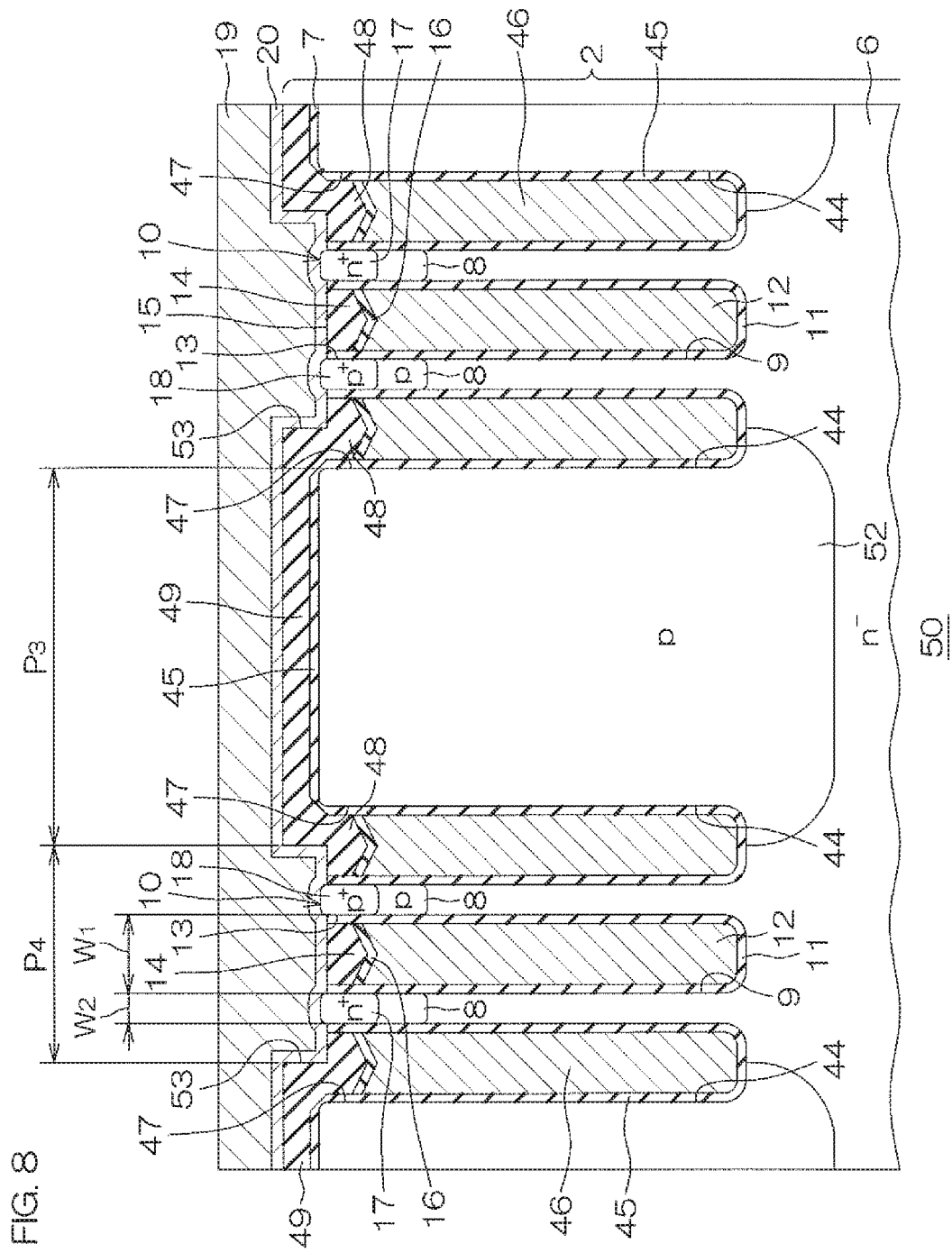
FIG. 8 is a schematic cross-sectional view of a semiconductor device according to a preferred embodiment of the present invention.

FIG. 8 is a schematic cross-sectional view of a semiconductor device 50 according to a preferred embodiment of the present invention. In FIG. 8, constituent elements different from those of the semiconductor device 1 described above are mainly described, the common constituent elements are identified with the same symbols and their description is omitted.

In the semiconductor device 51, an emitter trench 44 is formed so as to be opposite to the gate trench 9 via the n⁻-type drift region 6. As shown in FIG. 8, the emitter trenches 44 may be provided in pairs so as to sandwich each of the gate trenches 9. In FIG. 8, a plurality of trench units each of which includes the gate trench 9 and a pair of emitter trenches 44 are formed in a stripe shape.

In the emitter trench 44, as in the gate trench 9, an embedding electrode 46 may be arranged via an insulating film 45. The embedding electrode 46 may be electrically connected to the emitter electrode 19. The insulating film 45 and the embedding electrode 46 can be respectively formed in the same steps as the gate insulating film 11 and the gate electrode 12. Hence, in the emitter trench 44, above the embedding electrode 46, a space 47 defined by the upper surface of the embedding electrode 46 and both side surfaces of the emitter trench 44 may be formed.

In the space 47, an embedding insulating film 48 formed of an insulating material such as $SiO_2$ may be embedded. The embedding insulating film 48 may be formed integrally with a surface insulating film 49 that connects adjacent emitter trenches 44. The embedding insulating film 48 and the surface insulating film 49 can be formed in the same step as the embedding insulating film 14. For example, preferably, after the deposition of the insulating material 38 in FIG. 5G, a part necessary for the contact of the emitter electrode 19 is selectively etched to form a contact hole 53, and the parts other than the contact hole 53 are left as the surface insulating film 49.

In the front surface portion of the p-type base region 8 between the gate trench 9 and one emitter trench 44, the n⁺-type emitter region 17 is formed, and in the front surface portion of the p-type base region 8 between the gate trench 9 and the other emitter trench 44, the p⁺-type base contact region 18 is formed.

In the n⁻-type drift region 6 between adjacent emitter trenches 44, a p-type floating region 52 is formed. The p-type floating region 52 is opposite to the surface insulating film 49. The p-type floating region 52 is a semiconductor region in which a floating state is electrically maintained, and is separated from the gate trench 9 by the emitter trench 44 adjacent to the gate trench 9. The p-type floating region 52 may extend to a position (for example, a position beyond the bottom portion of the emitter trench 44) deeper than the p-type base region 8. In this way, it is possible to alleviate the collector-emitter voltage applied to the emitter trench 44 when a switching-off operation is performed. Hence, it is possible to prevent the device from being destroyed by rapid variations in voltage (dv/dt). The dopant concentration of the p-type floating region 52 is, for example, $5 \times 10^{15}$ cm⁻³ to $1 \times 10^{18}$ cm⁻³.

The spacing $P_3$ between adjacent emitter trenches 44 is, for example, 1.5 μm or more, and is preferably 3 μm or less. The spacing $P_4$ between a pair of emitter trenches 44 opposite to each other through the gate trench 9 is, for example, 3 μm or less. The spacing $P_4$ may be equal to that of, for example, the contact hole 53.

Since in the semiconductor device 50 described above, the embedding insulating films 14 and 48 are formed, as in the semiconductor device 1 described above, it is possible to achieve a reduction in the size of the device in which a design margin is removed. Furthermore, it is possible to achieve a high short circuit resistance amount with the p-type floating region 52. In other words, it is possible to achieve both the reduction in the size and high performance of the device. For example, with respect to the reduction in the size, it is possible to reduce the size of the contact hole 53 to about 3 μm.

FIGS. 9 to 11 are schematic cross-sectional views of the semiconductor device 51 according to the preferred embodiment of the present invention, and respectively correspond to cross sections of the semiconductor device 51 taken along lines A-A, B-B and C-C in FIG. 1. In FIGS. 9 to 11, constituent elements different from those of the semiconductor device 1 described above are mainly described, the common constituent elements are identified with the same symbols and their description is omitted.

In the semiconductor device 51, the embedding insulating film 14 is embedded in the space 13. The embedding insulating film 14 is formed of, for example, $SiO_2$. The embedding insulating film 14 includes a side surface 40 that protrudes beyond the front surface 7 of the active region 10 and that is continuous to the side surface 39 of the gate trench 9. In other words, the side surface 39 of the gate trench 9 and the side surface 40 of the embedding insulating film 14 are continuous along the direction of the depth of the gate trench 9 without any step. The expression "continuous without any step" means that a minute step formed by the thickness of a thin film such as the gate insulating film 11 is ignored.

Since the embedding insulating film 14 protrudes beyond the front surface 7, on the semiconductor substrate 2, a dug structure 41 which is formed by a step between the front surface 7 of the semiconductor substrate 2 and the upper surface 15 of the embedding insulating film 14 and in which the active region 10 is exposed to its bottom portion is formed. The dug structures 41 are formed in the entire semiconductor region in the stripe shape divided by the gate trenches 9.

The dug structure 41 may be formed at such a depth that as shown in FIGS. 9 and 10, the position of the depth of the front surface 7 of the active region 10 is located halfway along the direction of the thickness of the embedding insulating film 14. In other words, the embedding insulating film 14 may be formed so as to straddle the lower and upper sides of the front surface 7 of the active region 10. The depth of the dug structure 41 is, for example, 0.3 μm to 0.6 μm.

Between the embedding insulating film 14 and the gate electrode 12, the insulting thin film 16 intervenes. The insulting thin film 16 is formed of, for example, $SiO_2$. The insulting thin film 16 is thinner than the gate insulating film 11, and has a thickness of, for example, 150 to 250 Å (in this preferred embodiment, 200 Å).

In the active region 10, in the front surface portion of the p-type base region 8, a plurality of $n^+$-type emitter regions 17 are formed. Each of the $n^+$-type emitter regions 17 is formed so as to connect adjacent gate trenches 9. That the $n^+$-type emitter region 17 connects adjacent gate trenches 9 means that as shown in FIG. 1, each of the $n^+$-type emitter regions 17 is not divided while extending from one gate trench 9 to the other gate trench 9.

The $n^+$-type emitter regions 17 are aligned in a stripe shape that perpendicularly intersects the gate trenches 9 in the stripe shape. In this way, the gate trenches 9 and the $n^+$-type emitter regions 17 as a whole are formed in a lattice shape in a plan view. As shown in FIG. 1, the spacing $P_2$ of the adjacent $n^+$-type emitter regions 17 (the distance between the centers of the $n^+$-type emitter regions 17) is, for example, 3.5 μm to 10 μm. The width $W_3$ of the $n^+$-type emitter region 17 is, for example, 0.35 μm to 1.0 μm.

The $n^+$-type emitter region 17 is formed deeper than the bottom portion of the embedding insulating film 14, and is opposite to the gate electrode 12 via the gate insulating film 11. The depth of the $n^+$-type emitter region 17 from the front surface 7 is, for example, 0.2 μm to 0.5 μm. The dopant concentration of the $n^+$-type emitter region 17 is $1 \times 10^{19}$ $cm^{-3}$ to $5 \times 10^{20}$ $cm^{-3}$.

In the active region 10, in the front surface portion of the p-type base region 8, a plurality of $p^+$-type base contact regions 18 are formed. The $p^+$-type base contact regions 18 are formed in the entire region except the $n^+$-type emitter regions 17 in the active region 10. In other words, in the active region 10, in the front surface portion of the p-type base region 8, the $n^+$-type emitter regions 17 and the $p^+$-type base contact regions 18 are alternately arranged along the gate trenches 9. The width W4 of the $p^+$-type base contact region 18 is wider than the width $W_3$, and is, for example, 3 μm to 9 μm. In the active region 10 described above, the area ratio (the arrangement rate of the $n^+$-type emitter regions 17) of the $n^+$-type emitter regions 17 to the p-type base regions 8 is, for example, 20% or less, and is preferably 10 to 15%. In this way, it is possible to achieve a satisfactory short circuit resistance amount.

As shown in FIG. 11, the $p^+$-type base contact region 18 is formed at the same depth as the $n^+$-type emitter region 17. The depth of the $p^+$-type base contact region 18 from the front surface 7 is, for example, 0.2 μm to 0.8 μm. The dopant concentration of the $p^+$-type base contact region 18 is, for example, $5 \times 10^{18}$ $cm^{-3}$ to $1 \times 10^{20}$ $cm^{-3}$.

On the semiconductor substrate 2, an emitter electrode 19 is formed. The emitter electrode 19 is formed of, for example, an Al—Si—Cu alloy. The emitter electrode 19 enters the dug structure 41 and is connected to the $n^+$-type emitter region 17 and the $p^+$-type base contact region 18. Specifically, as shown in FIGS. 9 and 10, the emitter electrode 19 includes a contact part that is in contact with the active region 10 and that is connected to the $n^+$-type emitter region 17 and the $p^+$-type base contact region 18 and a non-contact part that is in contact with the embedding insulating film 14 and that is opposite to the gate electrode 12. The non-contact part and the gate electrode 12 are insulated with the embedding insulating film 14.

Between the semiconductor substrate 2 and the emitter electrode 19, as shown in FIGS. 9 and 10, a barrier film 20 having a Ti/TiN/Ti multilayer structure may intervene. The barrier film 20 is formed such that its one front surface and the other front surface are along projections and recesses on the semiconductor substrate 2 formed by the dug structure 41.

A collector electrode 21 is formed in the back surface 3 of the semiconductor substrate 2. The collector electrode 21 has an AlSi/Ti/Ni/Au multilayer structure in which the layers are deposited sequentially from the back surface 3.

As with the semiconductor device 1 described above, the semiconductor device 51 can also be used by being incorporated into, for example, an inverter circuit 22 as shown in FIG. 4.

A method of manufacturing the semiconductor device 51 will then be described.

In order to manufacture the semiconductor device 51, the same steps as shown in FIGS. 5A to 5G are first performed.

Figure 12A:
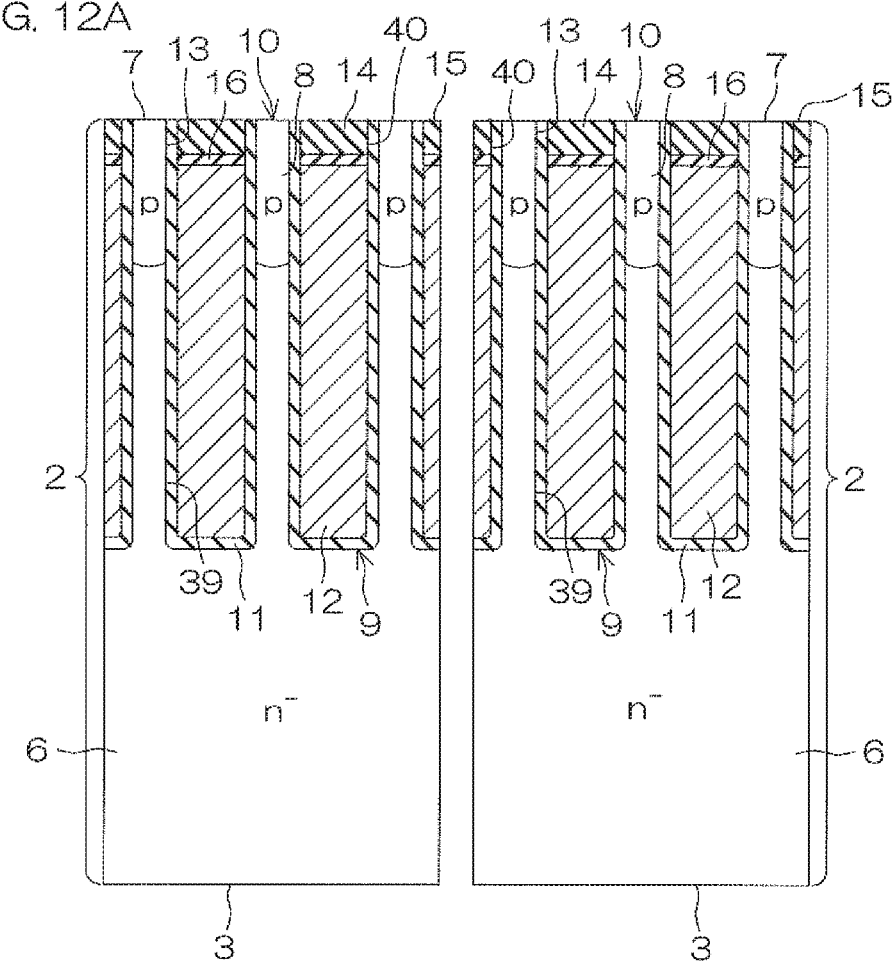

In FIG. 5G, after the deposition of the insulating material 38 on the semiconductor substrate 2, as shown in FIG. 12A, the insulating material 38 is etched back, and thus an unnecessary part of the insulating material 38 is removed. In this way, the embedding insulating film 14 embedded in the space 13 is formed. Here, the embedding insulating film 14 has the upper surface 15 in the same height position as the front surface 7 of the active region 10 or in a height position lower than the front surface 7. When the upper surface 15 is in the height position lower than the front surface 7 of the active region 10, its difference in height is caused by a recess formed by slightly over-etching the insulating material 38 when the insulating material 38 is etched back. Hence, the front surface 7 of the semiconductor substrate 2 is a flat surface in which the semiconductor (Si) surface and the insulator ($SiO_2$) surface are continuous without any step or is a substantially flat surface in which the insulation ($SiO_2$)

surface is slightly recessed with respect to the semiconductor (Si) surface to form an extremely shallow concave portion.

Figure 12B:
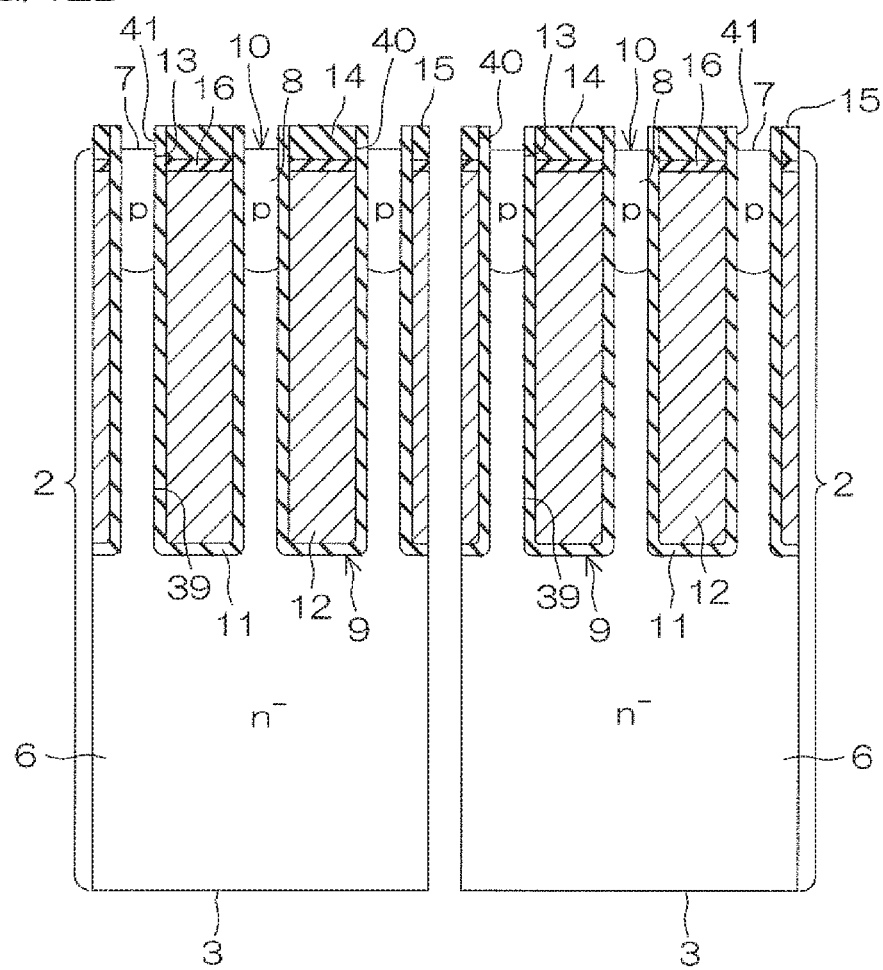

Next, as shown in FIG. 12B, the active region 10 sandwiched between the embedding insulating films 14 is selectively etched to form the dug structure 41. Here, since the embedding insulating film 14 ($SiO_2$) has an etching selection ratio with respect to the active region 10 (Si), it can be used as an etching mask. In this way, the dug structure 41 is formed in a self-aligned manner with respect to the dug structure 41.

Figure 12C:
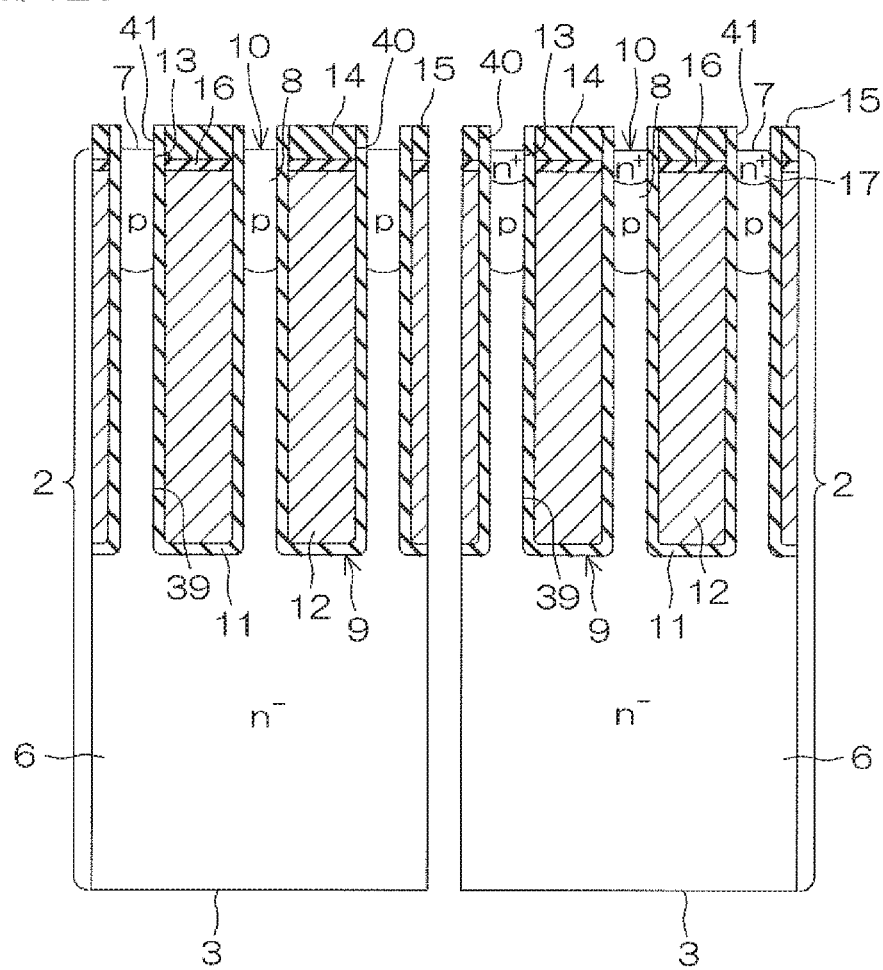

Next, as shown in FIG. 12C, an n-type dopant is ion-implanted (implantation) in the front surface 7 of the semiconductor substrate 2, and thereafter anneal processing is performed on the semiconductor substrate 2. In this way, the n-type dopant is subjected to drive-in diffusion, and thus the $n^+$-type emitter region 17 is formed.

Figure 12D:
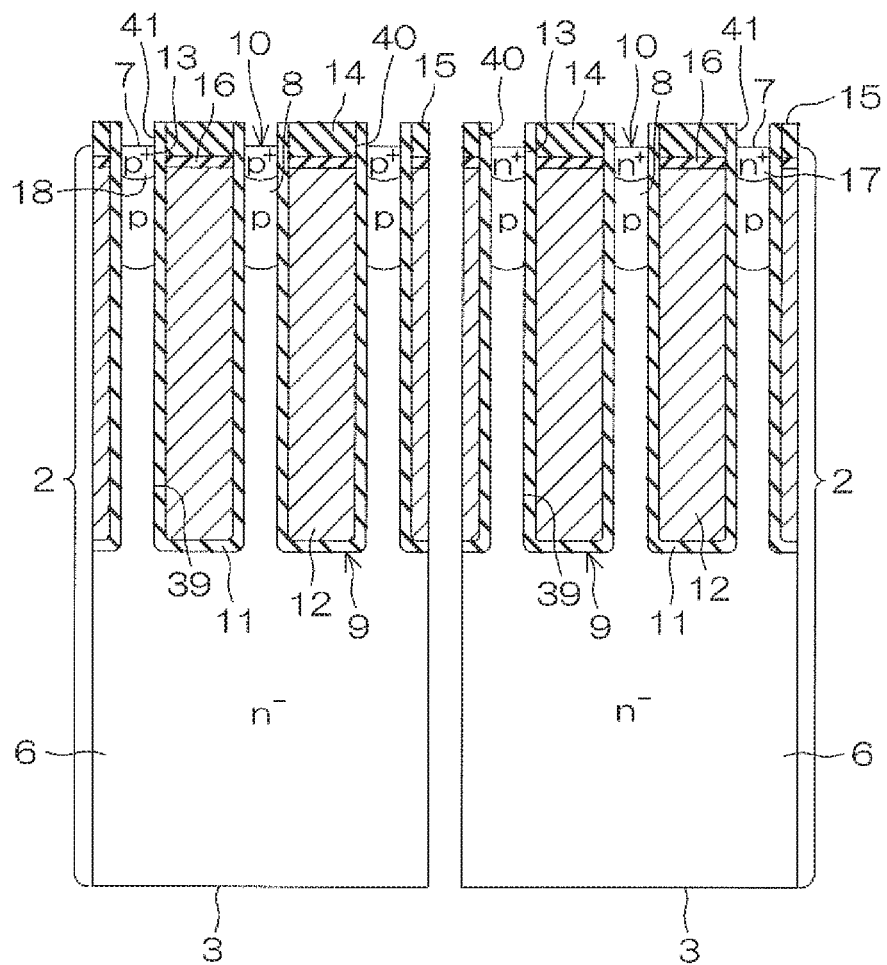

Next, as shown in FIG. 12D, a p-type dopant is ion-implanted (implantation) in the front surface 7 of the semiconductor substrate 2, and thereafter anneal processing is performed on the semiconductor substrate 2. In this way, the p-type dopant is subjected to drive-in diffusion, and thus the $p^+$-type base contact region 18 is formed.

Figure 12E:
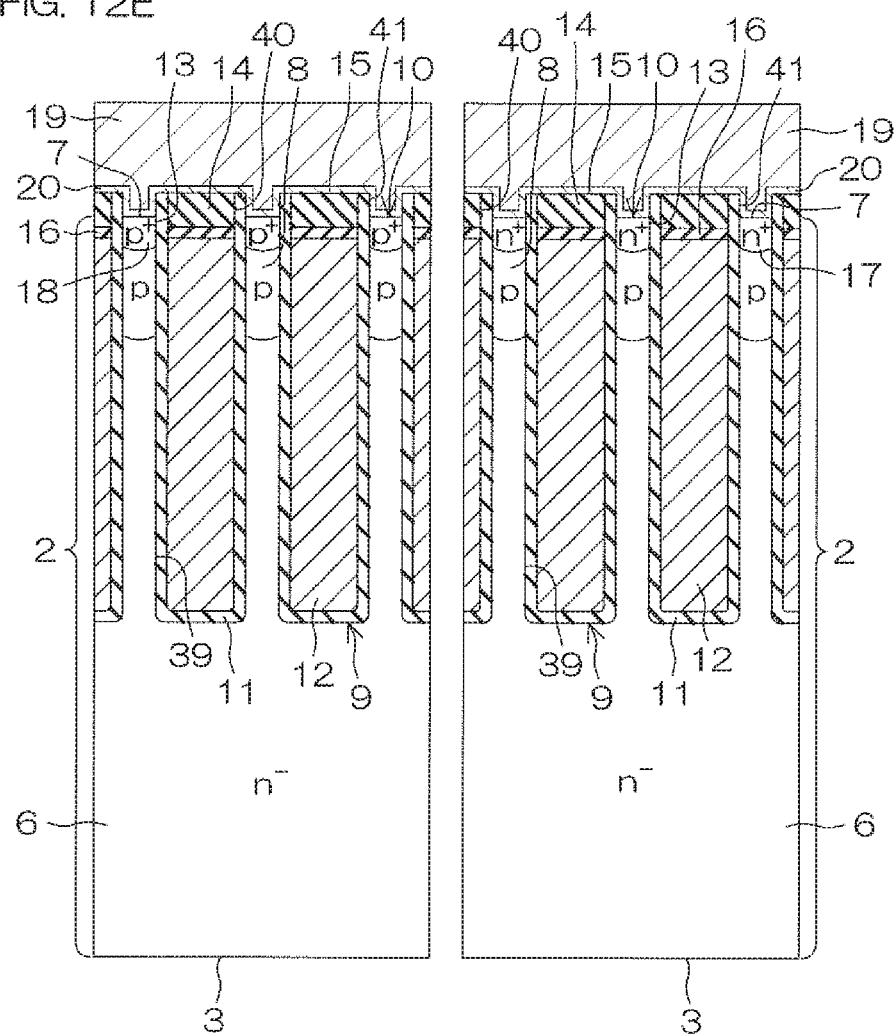

Next, on the semiconductor substrate 2, for example, by a sputtering method, a Ti film is deposited, and is subjected to anneal processing, and thereafter in the same method, a TiN film, a Ti film and an Al—Si—Cu alloy film are sequentially deposited. Then, the Ti/TiN/Ti/Al—Si—Cu alloy is patterned, and thus as shown in FIG. 12E, the emitter electrode 19 and the barrier film 20 are formed simultaneously.

Next, as necessary, the thickness of the semiconductor substrate 2 is reduced by grinding from the back surface 3, then as shown in FIG. 12F, n-type and p-type dopants are selectively ion-planted (implantation) in the back surface 3 of the semiconductor substrate 2 and thereafter anneal processing (in this preferred embodiment, laser anneal) is performed on the semiconductor substrate 2. In this way, the n-type and p-type dopants are subjected to drive-in diffusion to form the n-type buffer region 5 and the $p^+$-type collector region 4. Thereafter, for example, by a sputtering method, an AlSi film, a Ti film, a Ni film and an Au film are deposited sequentially. In this way, the collector electrode 21 is formed.

The steps described above are performed, and thus it is possible to obtain the semiconductor device 51 shown in FIGS. 9 to 11. FIGS. 12A to 12F show only part of the manufacturing process of the semiconductor device 51, and the manufacturing process may include steps that are not shown in FIGS. 12A to 12F.

Since with this semiconductor device 51, as shown in FIGS. 9 and 10, it is possible to insulate the gate electrode 12 and the emitter electrode 19 with the embedding insulating film 14, the entire semiconductor (Si) surface of the active region 10 between adjacent gate trenches 9 can be used as an emitter contact region. Hence, preferably, after the formation of the $n^+$-type emitter region 17 and the $p^+$-type base contact region 18 (FIGS. 12C and 12D), without a step of forming an insulating film such as an interlayer insulating film on the semiconductor substrate 2, as shown in FIG. 12E, the material of the emitter electrode 19 is directly deposited.

Hence, when the contact is formed in the $n^+$-type emitter region 17 and the $p^+$-type base contact region 18, it is not necessary to provide a design margin with consideration given to the displacement of a mask, variations in dimension and the like in a direction perpendicularly intersecting the gate trench 9. Furthermore, since as shown in FIG. 1, the structure of the $n^+$-type emitter region 17 is a bridged structure that connects adjacent gate trenches 9, in its formation, it is not necessary to provide the same design margin. Consequently, it is possible to achieve a reduction in the size of the device without any design margin.

Then, the width W2 of the active region 10 is decreased by the reduction in the size, and thus a hole density in the vicinity of the interface between the p-type base region 8 and the $n^-$-type drift region 6 is increased, with the result that it is possible to reduce an on-voltage. As in the semiconductor device 1, it is possible to prove the effect of increasing the hole density and the effect of reducing the on-voltage with FIGS. 6 and 7, respectively.

Hence, it is found that as in the semiconductor device 51, the spacing $P_1$ between the gate trenches 9 is reduced, and thus it is possible to increase the hole density and reduce the on-voltage. Consequently, while the spacing $P_1$ is maintained to acquire a relatively low on-voltage, the area ratio (the arrangement rate of the $n^+$-type emitter regions 17) of the $n^+$-type emitter regions 17 to the p-type base regions 8 is adjusted, and thus it is possible to easily control the short circuit resistance value. In other words, with the semiconductor device 51, it is possible to improve the trade-off relationship between the on-voltage and the short circuit resistance amount.

Furthermore, since in the semiconductor device 51, the dug structure 41 is formed, it is possible to reduce the distance from the semiconductor (Si) surface in the active region 10 to the apex portion of the gate electrode 12. Specifically, as shown in FIG. 11, as compared with a height position 42 of the front surface 7 when the dug structure 41 is not formed, it is possible to lower the front surface 7. Hence, even if the $n^+$-type emitter region 17 is formed more shallow, it is possible to reliably make the $n^+$-type emitter region 17 face the gate electrode 12. Since the $n^+$-type emitter region 17 is allowed to be shallow, it is possible to reduce the time in which the impurity is diffused when the $n^+$-type emitter region 17 is formed. In this way, as shown in FIG. 11, it is possible to reduce the spreading 43 of the impurity laterally in a direction within a plane along the front surface 7 of the semiconductor substrate 2. Consequently, it is possible to achieve the reduction in the size by reducing the loss of the pattern of the $n^+$-type emitter region 17 and to realize high performance (the reduction of the series resistance of the emitter electrode 19) by decreasing the depth (p-type base length) of the p-type base region 8 from the front surface 7.

Although the preferred embodiments of the present invention have been described above, the present invention can be implemented with another preferred embodiment.

For example, a configuration in which the conductive-type of the semiconductor parts of the semiconductor devices 1, 50 and 51 is inverted may be adopted. In other words, in the semiconductor devices 1, 50 and 51, the p-type part may be of n-type, and the n-type part may be of p-type.

Although in the preferred embodiments described above, only the configuration of the IGBT included in the semiconductor devices 1, 50 and 51 has been illustrated, the semiconductor device of the present invention may include, in a region different from the region where the IGBT is formed, elements (for example, a MOSFET and a diode) other than the IGBT.

In the semiconductor device 51, the bottom portion of the embedding insulating film 14 may be located in the same height position as the front surface 7 of the semiconductor substrate 2.

In the semiconductor device 51, the n+-type emitter region 17 may be divided in the process of extending from one gate trench 9 to the other gate trench 9.

Various types of design changes are possible within the scope of claims.

What is claimed is:

1. A semiconductor device comprising:
a first conductive-type semiconductor layer;
a second conductive-type base region that is arranged in a front surface portion of the first conductive-type semiconductor layer;
a plurality of trenches that extend from a front surface of the first conductive-type semiconductor layer beyond a bottom portion of the second conductive-type base region, an active region being defined between the plurality of trenches and having an upper surface at the front surface portion of the first conductive-type semiconductor layer;
a plurality of first conductive-type emitter regions, that are arranged in the active region, each connecting the trenches that are adjacent to each other such that each of the first conductive type emitter regions is not divided while extending from one of the trenches to another of the trenches and each having an upper surface at the front surface portion of the first conductive-type semiconductor layer;
a gate electrode that is embedded in the trenches;
an embedding insulating film that is embedded in the trenches on the gate electrode and that has an upper surface in the same height position as the front surface of the first conductive type semiconductor layer or in a height position lower than the front surface portion of the first conductive-type semiconductor layer;
a second conductive-type base contact region that is selectively arranged in the active region and that is connected to the second conductive-type base region at a bottom portion of the second conductive-type base contact region;
wherein the upper surface of the active region and the upper surface of the embedding insulating film providing a substantially flat surface;
an emitter electrode that is disposed over the substantially flat surface and that is electrically connected to the second conductive-type base region and the first conductive type emitter regions,
the trenches are formed in a stripe shape,
the first conductive-type emitter regions are formed in a stripe shape perpendicularly intersecting the trenches in the stripe shape,
the plurality of first conductive-type emitter regions and a plurality of the second conductive- type base contact regions are alternately arranged along the trenches in the active region such that the plurality of first conductive-type emitter regions and the plurality of the second conductive-type base contact regions are divided by one another,
the emitter electrode includes a first surface in contact with the plurality of first conductive- type emitter regions and the plurality of the second conductive-type base contact regions and a second surface opposite to the first surface,
the first surface of the emitter electrode extends continuously and flat across the plurality of striped trenches and a plurality of the active regions between the plurality of striped trenches, the first conductive-type emitter regions are formed deeper than the embedding insulating film and cross the boundary between the embedding insulating film and the gate electrode in a depth direction of the trench such that each of the first conductive-type emitter region is opposite to the embedding insulating film and the gate electrode in a lateral direction perpendicular to the depth direction,
the second conductive-type base contact region is formed shallower than the embedding insulating film such that a boundary between the second conductive-type base contact region and the second conductive-type base region continuously extending from one of the trenches to another of the trenches at a position closer to the front surface of the first conductive-type semiconductor layer than a boundary between the embedding insulating film and gate electrode, and
the second conductive-type base contact region is not opposite to the gate electrode in the lateral direction.

2. The semiconductor device according to claim 1, wherein the emitter electrode is a flat electrode.

3. The semiconductor device according to claim 1, wherein the second conductive-type base contact region is formed shallower than the first conductive-type emitter regions.

4. The semiconductor device according to claim 1, wherein
the second conductive-type base contact region is formed in an entire region of the active region other than the first conductive-type emitter regions.

5. The semiconductor device according to claim 1, wherein a spacing between the trenches adjacent to each other is 1 μm or less.

6. The semiconductor device according to claim 5, wherein a spacing between the first conductive-type emitter regions that are adjacent to each other is 3.5 μm to 10 μm.

7. The semiconductor device according to claim 1, wherein the embedding insulating film is formed of $SiO_2$.

8. The semiconductor device according to claim 1, wherein the gate electrode is formed of polysilicon.

9. The semiconductor device according to claim 1, wherein the first conductive-type semiconductor layer is formed of Si.

10. The semiconductor device according to claim 1, wherein the emitter electrode is formed of an Al—Si—Cu alloy.

11. The semiconductor device according to claim 10, further comprising:
a barrier layer that has a Ti/TiN/Ti multilayer structure arranged between the emitter electrode and the first conductive-type semiconductor layer.

12. The semiconductor device according to claim 1, wherein
each of the first conductive-type emitter region has a rectangular shape extending in a direction perpendicular to the trench such that the first conductive-type emitter region divides the second conductive-type base region in the active region, and
each the second conductive-type base contact region has a rectangular shape extending along the trench in a region sandwiched by the adjacent the first conductive-type emitter regions.

13. The semiconductor device according to claim 1, wherein an interface between the first conductive-type emitter region and the second conductive-type base region is deeper than any portion at a bottom of the embedding insulating film throughout.

14. The semiconductor device according to claim 1, wherein the emitter electrode is a flat electrode including the second surface that extends parallel to the first surface.

15. A semiconductor device comprising:
a first conductive-type semiconductor layer;
a second conductive-type base region that is arranged in a front surface portion of the first conductive-type semiconductor layer;
a plurality of trenches that extend from a front surface of the first conductive-type semiconductor layer beyond a bottom portion of the second conductive-type base region, an active region being defined between the plurality of trenches and having an upper surface at the front surface portion of the first conductive-type semiconductor layer;
a plurality of first conductive-type emitter regions, that are arranged in the active region, each connecting the trenches that are adjacent to each other and each having an upper surface at the front surface portion of the first conductive-type semiconductor layer;
a gate electrode that is embedded in the trenches;
an embedding insulating film that is embedded in the trenches on the gate electrode and that has an upper surface in the same height position as the front surface of the first conductive type semiconductor layer or in a height position lower than the front surface portion of the first conductive-type semiconductor layer;
wherein the upper surface of the active region and the upper surface of the embedding insulating film providing a substantially flat surface;
an emitter electrode that is disposed over the substantially flat surface and that is electrically connected to the second conductive-type base region and the first conductive type emitter regions; and
a second conductive-type base contact region that is selectively arranged in the active region and that is connected to the second conductive-type base region at a bottom portion of the second conductive-type base contact region,
wherein the second conductive-type base contact region is formed in an entire region of the active region other than the first conductive-type emitter regions,
the trenches are formed in a stripe shape,
the first conductive-type emitter regions are formed in a stripe shape perpendicularly intersecting the trenches in the stripe shape,
the plurality of first conductive-type emitter regions and a plurality of the second conductive-type base contact regions are alternately arranged along the trenches in the active region such that the plurality of first conductive-type emitter regions and the plurality of the second conductive-type base contact regions are divided by one another,
the emitter electrode includes a first surface in contact with the plurality of first conductive-type emitter regions and the plurality of the second conductive-type base contact regions and a second surface opposite to the first surface,
the first surface of the emitter electrode extends continuously and flat across the plurality of striped trenches and a plurality of the active regions between the plurality of striped trenches,
the first conductive-type emitter regions are formed deeper than the embedding insulating film and cross the boundary between the embedding insulating film and the gate electrode in a depth direction of the trench such that each of the first conductive-type emitter region is opposite to the embedding insulating film and the gate electrode in a lateral direction perpendicular to the depth direction,
the second conductive-type base contact region is formed shallower than the embedding insulating film such that a boundary between the second conductive-type base contact region and the second conductive-type base region continuously extending from one of the trenches to another of the trenches at a position closer to the front surface of the first conductive-type semiconductor layer than a boundary between the embedding insulating film and gate electrode, and
the second conductive-type base contact region is not opposite to the gate electrode in the lateral direction.

16. The semiconductor device according to claim 15, wherein the emitter electrode is a flat electrode.

17. The semiconductor device according to claim 15, wherein the second conductive-type base contact region is formed shallower than the first conductive-type emitter regions.

18. The semiconductor device according to claim 15, wherein a spacing between the trenches adjacent to each other is 1 um or less.

19. The semiconductor device according to claim 15, wherein each of the first conductive-type emitter region has a rectangular shape extending in a direction perpendicular to the trench such that the first conductive-type emitter region divides the second conductive-type base region in the active region, and
each of the second conductive-type base contact region has a rectangular shape extending along the trench in a region sandwiched by the adjacent the first conductive-type emitter regions.

20. The semiconductor device according to claim 15, wherein the emitter electrode is a flat electrode including the second surface that extends parallel to the first surface.

* * * * *